United States Patent
Cho et al.

(10) Patent No.: US 8,023,319 B2
(45) Date of Patent: Sep. 20, 2011

(54) PHASE CHANGE MEMORY

(75) Inventors: Beak-Hyung Cho, Hwaseong-si (KR);
Byung-Gil Choi, Yongin-si (KR);
Joon-Min Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 136 days.

(21) Appl. No.: 12/457,319

(22) Filed: Jun. 8, 2009

(65) Prior Publication Data
US 2009/0316474 A1   Dec. 24, 2009

(30) Foreign Application Priority Data
Jun. 23, 2008   (KR) .................... 10-2008-0059086

(51) Int. Cl.
*G11C 11/00*   (2006.01)
(52) U.S. Cl. .................. 365/163; 365/148; 365/200
(58) Field of Classification Search .............. 365/163, 365/200, 148
See application file for complete search history.

(56) References Cited

U.S. PATENT DOCUMENTS

| | | | | |
|---|---|---|---|---|
| 6,996,766 | B2 * | 2/2006 | Cypher | 714/764 |
| 7,359,261 | B1 * | 4/2008 | Wu et al. | 365/200 |
| 7,746,712 | B2 * | 6/2010 | Kang et al. | 365/201 |
| 7,751,264 | B1 * | 7/2010 | Wu et al. | 365/200 |
| 7,778,070 | B2 * | 8/2010 | Nirschl et al. | 365/163 |
| 2003/0002364 | A1 | 1/2003 | Chou | |
| 2007/0070734 | A1 | 3/2007 | Hsu et al. | |

FOREIGN PATENT DOCUMENTS

| | | |
|---|---|---|
| KR | 10-2001-0037512 | 5/2001 |
| KR | 10-2007-0093747 | 9/2007 |

* cited by examiner

*Primary Examiner* — Pho M Luu
(74) *Attorney, Agent, or Firm* — Harness, Dickey & Pierce

(57) ABSTRACT

The phase change memory device includes a plurality of memory banks, a plurality of local conductor lines connected to the plurality of memory banks, at least one global conductor line connected to the plurality of local conductor lines, and at least one repair control circuit configured to selectively replace at least one of the at least one global conductor line with at least one redundant global conductor line and configured to selectively replace at least one of the plurality of local conductor lines with at least one redundant local conductor line.

19 Claims, 18 Drawing Sheets

PHASE CHANGE MEMORY

PRIORITY STATEMENT

This application claims priority under 35 U.S.C §119 to Korean Patent Application No. Korean Patent Application No. 10-2008-0059086, filed on Jun. 23, 2008, in the Korean Intellectual Property Office, the entire contents of which are incorporated by reference.

BACKGROUND

1. Technical Field

Example embodiments of the present invention relate to a semiconductor memory device, for example, to a phase change memory device.

2. Description of Related Art

A semiconductor memory device is a memory device that stores data and from which stored data may be read. The semiconductor memory device may be divided into a volatile memory device and a nonvolatile memory device.

The volatile memory device is a memory device in which retained data is erased when a power supply is cut off. Some examples of the volatile memory device are SRAM, DRAM and SDRAM. The nonvolatile memory device is a memory device in which retained data is not erased even when power supply is cut off. Some examples of the nonvolatile memory device are ROM, PROM, EPROM, EEPROM, flash memory device, PRAM, MRAM, RRAM, and FRAM.

A phase change memory (PRAM) is a memory device that stores data using a material of which a resistance varies with temperature, for example, chalcogenide. When a temperature higher than the melting point of chalcogenide is applied to the chalcogenide for a relatively shorter period of time, the chalcogenide becomes an amorphous state. When a temperature lower than the melting point of chalcogenide is applied to the chalcogenide for a longer period of time, the chalcogenide becomes a crystalline state. A resistance of the chalcogenide in the crystalline state is lower than a resistance of the chalcogenide in the amorphous state. Thus, the phase change memory device may store data by changing chalcogenide into a crystalline state or an amorphous state.

SUMMARY

According to an example embodiment, a phase change memory device includes a plurality of memory banks, a plurality of local conductor lines connected to the plurality of memory banks, at least one global conductor line connected to the plurality of local conductor lines, and at least one repair control circuit configured to selectively replace at least one of the at least one global conductor line with at least one redundant global conductor line and configured to selectively replace at least one of the plurality of local conductor lines with at least one redundant local conductor line.

In another example embodiment, a phase change memory device includes a plurality of memory banks each including a plurality of address groups and at least one redundant address group, a plurality of local conductor lines connected to each of the address groups and at least one redundant local conductor line connected to the at least one redundant address group, at least one global conductor line connected to the plurality of local conductor lines of each of the address groups, at least one redundant global conductor line connected to the at least redundant local conductor line of the at least one redundant address group, and at least one repair control circuit configured to selectively replace at least one of the at least one global conductor line with the at least one redundant global conductor line and configured to selectively replace at least one of the plurality of local conductor lines with the at least one redundant local conductor line.

In yet another example embodiment, a phase change memory device includes at least one global conductor line connected to a plurality of local conductor lines, and at least one repair control circuit configured to selectively replace at least one of the at least one global conductor line with at least one redundant global conductor line and configured to selectively replace at least one of the plurality of local conductor lines with at least one redundant local conductor line, where the at least one repair control circuit includes a master repair circuit including a plurality of fuses corresponding to the at least one global conductor line and receiving a column address, where the master repair circuit activates a first active signal in response to an output of at least one of the plurality of fuses of the master repair circuit, a first slave repair circuit including a plurality of fuses corresponding to a plurality of memory banks and receiving a bank address, where the first slave repair circuit activates a second active signal in response to an output of at least one of the plurality of fuses of the first slave repair circuit, and a second slave repair circuit including a plurality of fuses corresponding to the plurality of local conductor lines, the plurality of fuses of the second slave repair circuit receiving the column address and at least one of the first and second active signals, where the second slave repair circuit activates at least one flag in response to an output of at least one of the plurality of fuses of the second slave repair circuit.

An example embodiment may further include a controller that controls the phase change memory device.

BRIEF DESCRIPTION OF THE DRAWINGS

The above and other features and advantages will become more apparent by describing in detail example embodiments thereof with reference to the attached drawings in which.

DETAILED DESCRIPTION OF THE EMBODIMENTS

Figure 1:
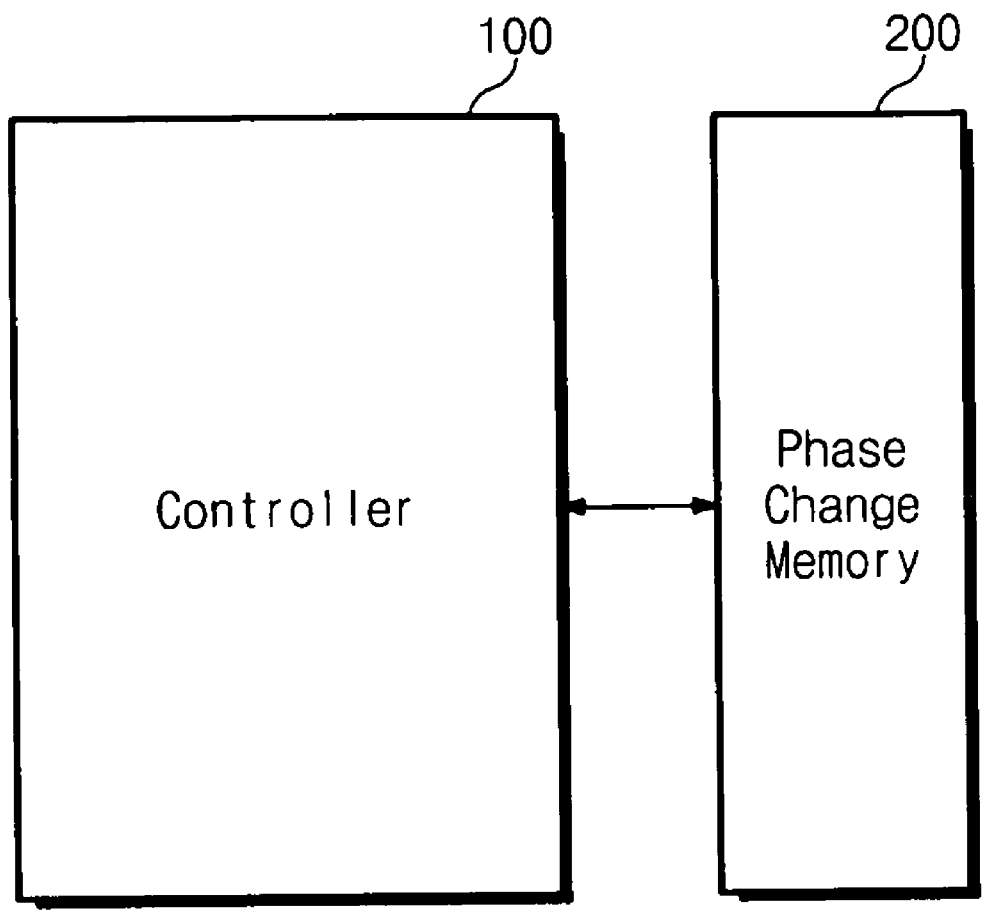
FIG. 1 is a block diagram depicting a memory system according to an example embodiment of the present invention.

The present invention will now be described more fully hereinafter with reference to the accompanying drawings, in which example embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

FIG. 1 is a block diagram depicting a memory system 10 according to an example embodiment of the present invention. Referring to FIG. 1, the memory system 10 according to an example embodiment of the present invention includes a controller 100 and a phase change memory device 200.

The controller 100 is connected to a host (not shown) and the phase change memory device 200. The controller 100 transfers data read from the phase change memory device 200 to the host, or stores data transmitted from the host in the phase change memory device 200.

The controller 100 may include a RAM (not shown), a processing unit (not shown), a host interface (not shown), and a memory interface (not shown). The RAM is used as an operation memory of the processing unit. The processing unit controls the entire operations of the controller 100. The host interface includes a protocol that performs data exchange between the host and the controller 100. For example, the controller 10 may be configured to communicate with an external device (host) through one of the various interface protocols, for example, a USB, MMC, PCI-E, Advanced Technology Attachment (ATA), Serial-ATA, Parallel-ATA, SCSI, ESDI, and Integrated Drive Electronics (IDE). The memory interface interfaces with a phase change memory device 200. The controller 100 may further include an error correction block. The error correction block detects and corrects error in the data read from the phase change memory device 200.

The controller 100 and the phase change memory device 200 may be integrated into one semiconductor device. For example, the controller 100 and the phase change memory device 200 are integrated into one semiconductor device to form a memory card. In another example embodiment, the controller 100 and the phase change memory device 200 may be integrated into one semiconductor device to form a Solid State Disk/Drive (SSD). When the memory system 10 is used as an SSD, the operation speed of the host connected to the memory system 10 may be improved.

Figure 2:
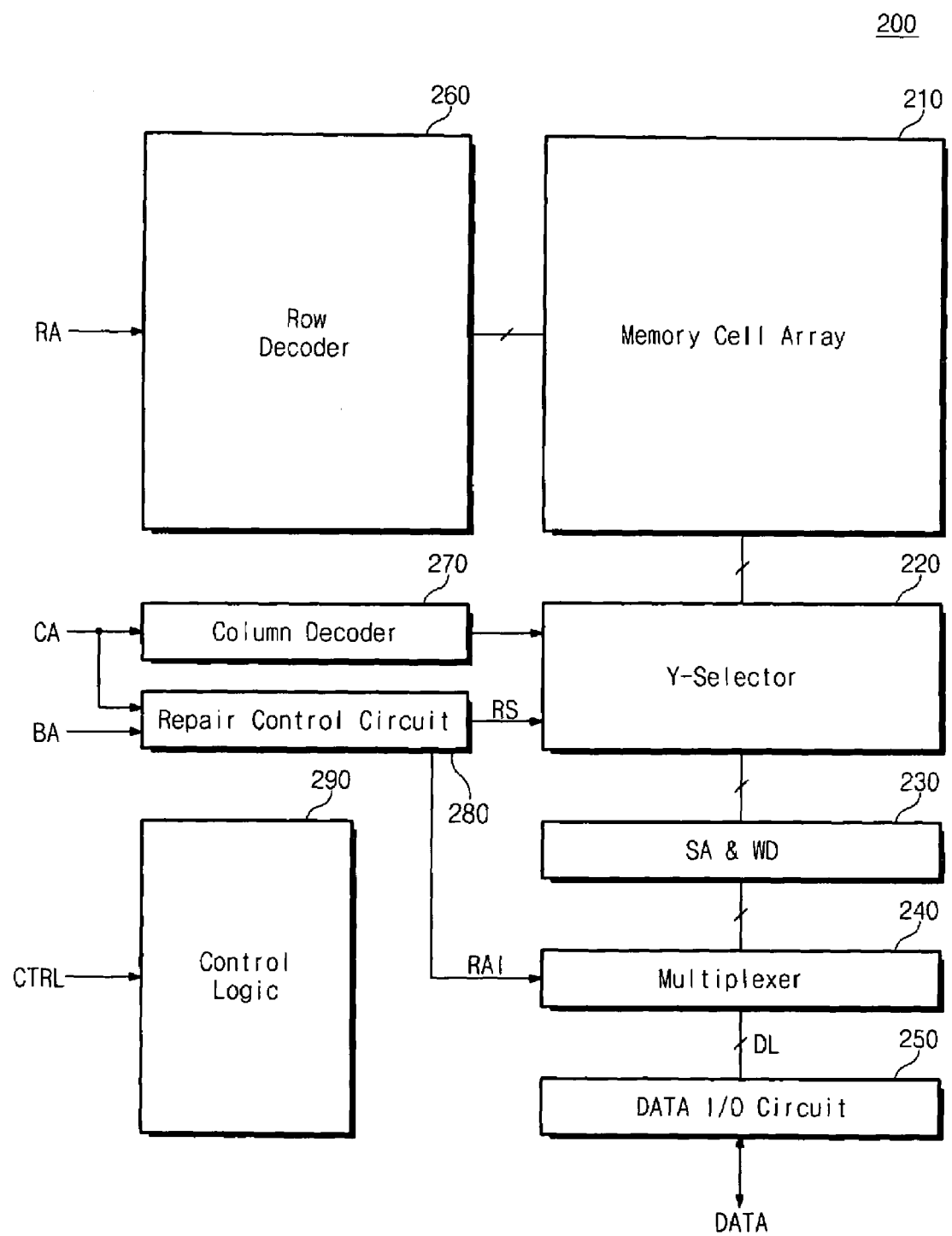
FIG. 2 is a block diagram depicting an example embodiment of the phase change memory device of FIG. 1.

FIG. 2 is a block diagram depicting an example embodiment of the phase change memory device 200 of FIG. 1. Referring to FIG. 2, the phase change memory device 200 includes a memory cell array 210, a column selector 220, a sense amplifier/write drive circuit 230, a multiplexer 240, a data input/output circuit 250, a row decoder 260, a column decoder 270, a repair control circuit 280, and a control logic 290.

The memory cell array 210 includes a plurality of phase change memory cells (not shown). The phase change memory cells may have a resistance that varies according to an applied temperature. For example, the phase change memory cells may include chalcogenide in which the resistance varies according to the applied temperature.

The chalcogenide may change into an amorphous state when a temperature higher than the melting point of the chalcogenide is applied to the chalcogenide for a shorter period of time. The chalcogenide may change into a crystalline state when a temperature lower than the melting point of the chalcogenide is applied to the chalcogenide for a longer period of time. The resistance of the chalcogenide in the crystalline state is lower than the resistance of the chalcogenide in the amorphous state. Thus, the phase change memory device may store data by changing the chalcogenide into a crystalline state or an amorphous state.

The phase change memory cells are connected to bitlines and wordlines formed in a layer structure. For example, the bitlines consist of local bitlines and global bitlines, and the wordlines consist of local wordlines and global wordlines. The memory cell array 210 will be described in further detail with reference to FIGS. 3 and 4.

The column selector 220 is connected to the memory cell array 210 via the bitlines. The column selector 220 selects the bitlines in response to a control by the column decoder 270. The column selector 220 selects redundant bitlines in response to control signals transmitted from the repair control circuit 280. The selected bitlines/redundant bitlines are electrically connected to the sense amplifier/write drive circuit 230 via the column selector 220.

The sense amplifier/write drive circuit 230 is electrically connected to the selected bitlines by the column selector 220. The sense amplifier/write drive circuit 230 detects data stored in the memory cell connected to the selected bitline, and writes data in the memory cell connected to the selected bitline. The sense amplifier/write drive circuit 230 includes a plurality of sense amplifiers/write drivers (not shown) and a plurality of redundant sense amplifier/write drivers (not shown). The respective sense amplifier/write drivers and the respective redundant sense amplifier/write drivers sense data stored in the memory cell that is connected to the corresponding bitline/redundant bitline, or sense write data in the memory cell connected to the corresponding bitline. The sense amplifier/write drive circuit 230 is connected to the multiplexer 240.

The multiplexer 240 selects sense amplifier/write drivers of the sense amplifier/write drive circuit 230. When redundant flag signal (RAI) is transmitted from the repair control circuit 280, the multiplexer 240 selects the redundant sense amplifier/write driver(s). The selected sense amplifier/write driver(s) are electrically connected to the data input/output circuit 250 via the multiplexer 240.

The data input/output circuit 250 exchanges data with an external device (not shown). For example, the data input/output circuit 250 may exchange data with the controller 100 of FIG. 1. Write data transmitted from an external device to the data input/output circuit 250 is transmitted to the sense amplifier/write driver circuit 230 via data lines DL and the multiplexer 240, and written in the memory cells connected to the selected bitline via the column selector 220. The data read from the memory cell array 210 is transmitted to an external device via the column selector 220, sense amplifier/write driver circuit 230, multiplexer 240, and/or data input/output circuit 250.

A row decoder 260 receives a row address RA from an external device (not shown). The row decoder 260 decodes the row address RA, and selects wordlines of the cell array 210 in response to the decoded row address DRA. For example, the row address RA may be provided from the controller 100 of FIG. 1.

The column decoder 270 receives a column address CA from an external device (not shown). The column decoder 270 decodes the column address CA, and controls the column selector 220 so that bitlines may be selected in response to the decoded column address DCA. For example, the column address CA may be provided from the controller 100 of FIG. 1.

The repair control circuit 280 also receives column address CA and block address BA from the external device. The repair control circuit 280 stores repair information of the bitlines of the memory cell array 210. When the column address CA and the block address BA transmitted from the external device indicates the repaired bitlines, the repair control circuit 280 activates control signal RS and redundant flag signal RAI. The column selector 220 selects redundant bitlines in response to the activated control signal RS. The multiplexer 240 selects the redundant sense amplifier/write drivers of the sense amplifier/write driver circuit 230, in response to the activated redundant flag signal RAI. For example, the repair control circuit 280 may store repair information by means of short-circuiting fuses. The repair control circuit 280 is described in further detail with reference to FIGS. 5a-5e.

A control logic 290 receives control signal CTRL from an external device (not shown). The control logic 290 controls the entire operation of the phase change memory device 200 in response to the control signal. CTRL. For example, the control signal CTRL is provided from the controller 100 of FIG. 1.

Figure 3:
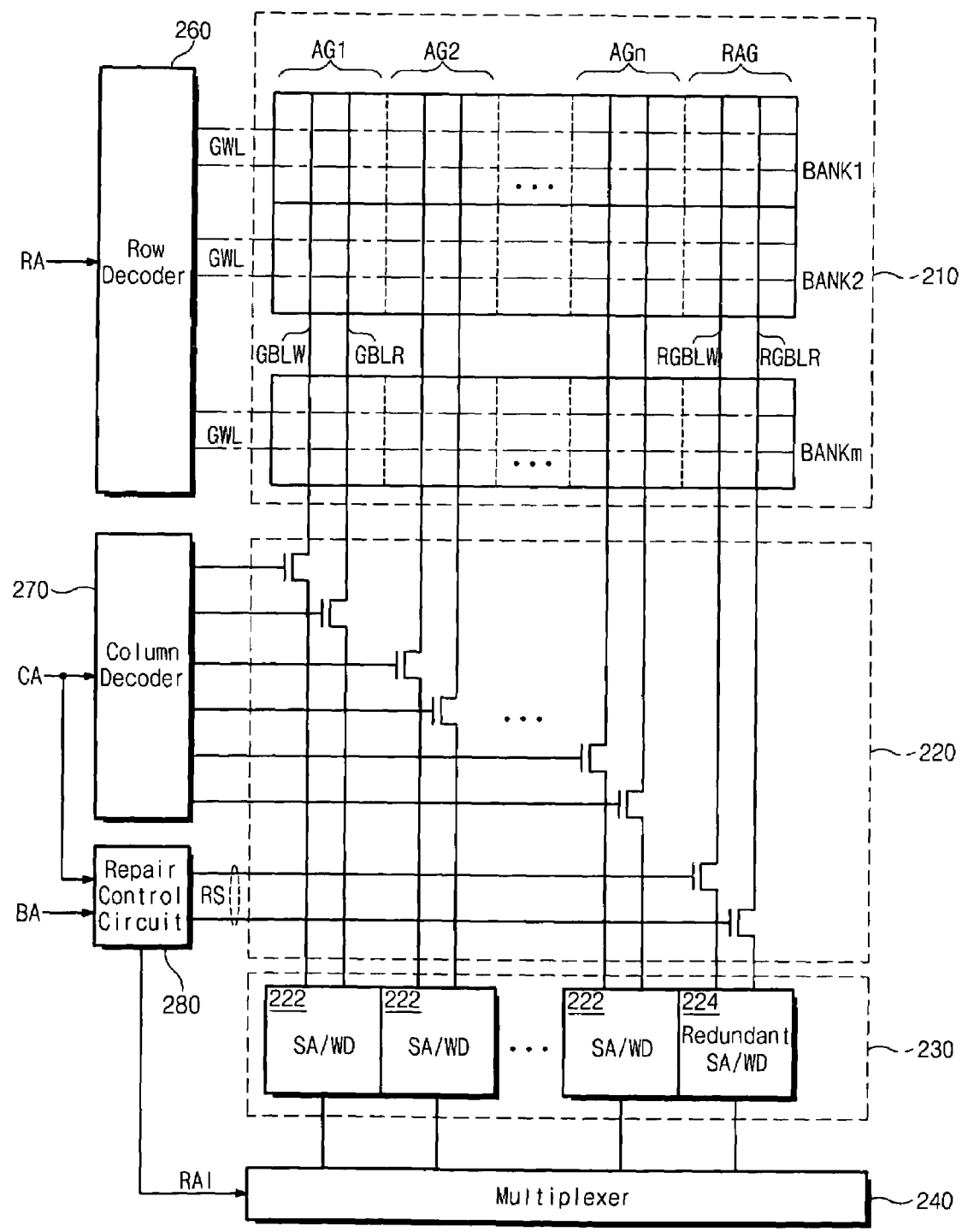
FIG. 3 is a block diagram depicting memory banks of the memory cell array of FIG. 2.

FIG. 3 is a block diagram depicting memory banks of the memory cell array 210 of FIG. 2. Referring to FIG. 3, the memory cell array 210 includes a plurality of memory banks BANK1 to BANKm. The memory banks BANK1 to BANKm according to an example embodiment of the present invention are arranged in a stacked structure. For example, the memory banks BANK1 to BANKm are arranged in a direction of the bitlines. However, an example embodiment of the present invention is not limited to the memory banks BANK1 to BANKm being arranged in the stacked structure.

The respective banks include a plurality of address groups AG1 to AGn and a redundant address group RAG. In FIG. 3, although it is shown that each of the banks includes one redundant address group RAG, the redundant address group RAG, according to an example embodiment of the present invention, is not limited to being given one group for each bank. For example, each bank may include two or more redundant address groups RAG.

The respective address groups AG each include a plurality of phase change memory cells. The phase change memory cells of each address group AG are connected to local conductor lines (not shown). The phase change memory cells of the redundant address group RAG are connected to redundant local bitlines (not shown). For example, a plurality of local bitlines are connected to an address group AG1 of the BANK1, and a plurality of local bitlines are also connected to an address group AG2 of the BANK2.

In another example embodiment, phase change memory cells of the respective address groups AG are connected to local wordlines (not shown). The phase change memory cells of the redundant address group RAG are connected to redundant local wordlines (not shown). For example, a plurality of local wordlines are connected to the address group AG1 of the BANK1, and a plurality of local wordlines are also connected to the address group AG2 of the BANK2.

The local conductor lines connected to the respective address groups AG are connected to at least one of the global conductor lines. For example, the local bitlines of each of the address groups AG are connected to a global bitline for reading GBLR and a global bitline for writing GBLW. The redundant local bitlines of the redundant address group RAG are connected to redundant global bitline for reading RGBLR and redundant global bitline for writing RGBLW. Thus, the global bitline for reading GBLR and the global bitline for writing GBLW are provided in at least one of the address groups AG.

In another example embodiment, the local wordlines of the respective address groups AG are connected to the global wordlines GWL. In FIG. 3, two global wordlines GWL are shown to be provided for one address group AG. However, the number of the global wordlines GWL connected to the address group AG may be more or less than two. The global wordlines GWL are connected to the local wordlines of the address groups AG1 to AGm, RAG in the same BANK.

Although not shown in FIG. 3, a local row decoder and a local column decoder are provided in the respective address groups AG. The local row decoder selects local wordlines, and the local column decoder selects local bitlines.

The global bitline for reading GBLR and global bitline for writing GBLW are connected to the column selector 220. The column selector 220 includes a plurality of switching means. For example, the switching means are depicted as transistors in FIG. 3. The column selector 220 electrically connects the global bitlines for reading and writing GBLR and GBLW to the sense amplifier/write drive circuit 230 in response to a control by the column decoder 270. The column selector 220 electrically connects the redundant global bitlines RGBLR and RGBLW to the sense amplifier/write drive circuit 230 in response to the control signal RS provided from the repair control circuit 280.

The sense amplifier/write drive circuit 230 includes a plurality of sense amplifier/write drivers 222 and a redundant sense amplifier/write driver 224. The respective sense amplifier/write drivers 222 are connected to the corresponding global bitlines for reading and writing GBLR and GBLW via the column selector 220. The redundant sense amplifier/write driver 224 is connected to the redundant global bitline for reading RGBLR and redundant global bitline for writing RGBLW via the column selector 220.

Figure 4:
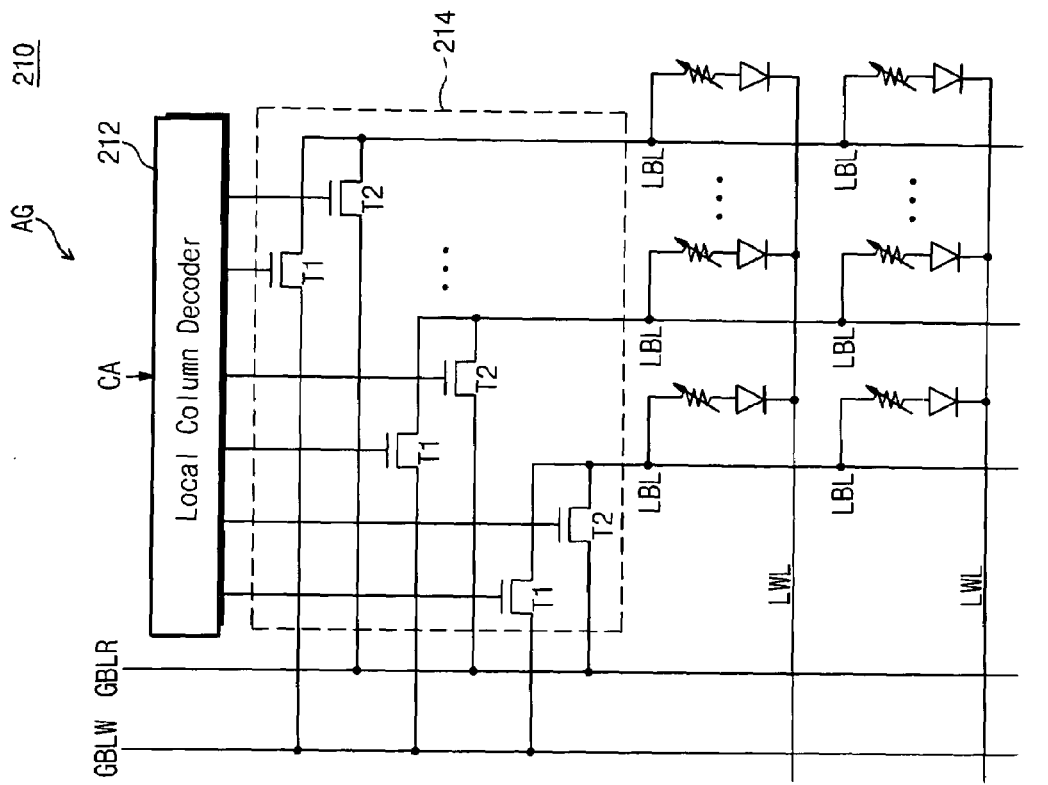
FIG. 4 is a circuit diagram depicting address groups of FIG. 3.
Figure 4:
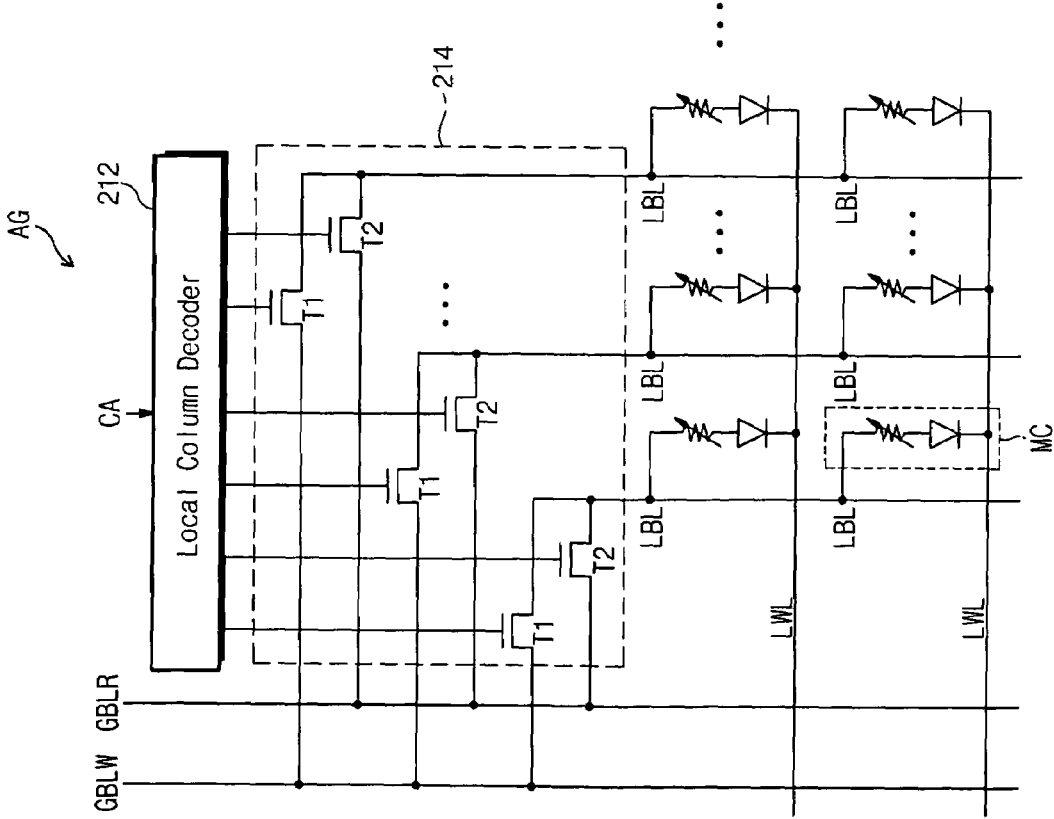

FIG. 4 is a circuit diagram depicting address groups AG of FIG. 3. For example, two address groups are depicted in FIG. 4. Referring to FIG. 4, the respective address groups AG each include a local column decoder 212, a local column selector 214, and phase change memory cells MC.

The phase change memory cells MC are provided between each of the local bitlines LBL and the local wordlines LWL. Each of the phase change memory cells MC is composed of one variable resistance and one diode. For example, the variable resistance includes a chalcogenide. If a temperature higher than the melting point of the chalcogenide is applied for a relatively shorter period of time, the chalcogenide becomes an amorphous state having a relatively high resistance. If a temperature lower than the melting point of the chalcogenide is applied for a relatively longer period of time, the chalcogenide becomes a crystalline state having a relatively low resistance. Thus, the phase change memory cell MC may store data by changing the chalcogenide into an amorphous state or a crystalline state.

The phase change memory cells MC are connected between the local bitlines LBL and the local wordlines LWL, respectively. The local bitlines LBL are electrically connected selectively to the global bitlines for reading and writing GBLR and GBLW via the local column selector 214. A local row decoder (not shown) may be provided for each of the address groups AG. The local wordlines LWL of the respective row address groups AG are connected to the local row decoder. The local row decoder receives the row address to select the local wordlines LWL. The local wordlines LWL of the address groups AG1 to AGm of the respective the memory banks BANK are connected to one or more global wordlines (not shown).

The local column selector 214 includes pluralities of a first switching means T1 and a second switching means T2. For example, the pluralities of the first and second switching means T1 and T2 may be first transistors T1 and second transistors T2. The local bitlines LBL are connected to the global bitline for writing GBLW via the first transistors T1. The local bitlines LBL are connected to the global bitlines for reading GBLR via the second transistors T2. The first and second transistors T1 and T2 are controlled by the local column decoder 212.

The local column decoder 212 receives the column address CA. The local column decoder 212 decodes the column address CA, and controls the first and second transistors T1 and T2 in response to the decoded column address DCA. When the local column decoder 212 activates the first transistors T1, the local bitlines LBL become connected to the global bitline for writing GBLW. When the local column decoder 212 activates the second transistors T2, the local bitlines LBL become connected to the global bitline for reading GBLR.

The phase change memory device 200 of FIG. 2, according to an example embodiment of the present invention, includes global bitlines for reading and global bitlines for writing. Accordingly, a writing operation on one of the memory banks BANK2 may be performed while a reading operation is performed on another of the memory banks BANK1, and an access speed of the phase change memory device maybe increased or accelerated.

In FIG. 4, the global bitlines for reading and writing GBLR and GBLW are shown adjacent to each other. However, according to an example embodiment of the present invention, the global bitlines for reading and writing GBLR and GBLW are not limited to being adjacent to each other. In a case where a reading and writing operation is performed on the individual memory banks BANK, an interference due to coupling effect may occur between the global bitlines for reading and writing GBLR and GBLW. In order to prevent interference due to coupling, the global bitlines for reading and writing GBLR and GBLW may be interposed for a distance there between. For example, the global bitlines for writing GBLW may be formed so that they are interposed for an interval from the global bitlines for reading GBLR.

The phase change memory device 200 according to an example embodiment of the present invention may repair one of the local conductor line or the global conductor line. For example, if a defect occurs in the memory cells connected to the local bitline LBL, or a defect occurs in the local bitline LBL, the local bitline LBL may be repaired as a redundant local bitline. In another example embodiment, if defect occurs in the global bitlines for reading GBLR or the global bitlines for writing GBLW, the global bitlines for reading and writing GBLR and GBLW may be repaired into redundant global bitlines for reading and writing RGBLR and RGBLW. Information on the repaired local bitline LBL or the repaired global bitlines for reading and writing GBLR and GBLW are stored in the repair control circuit 280.

Figure 5A:
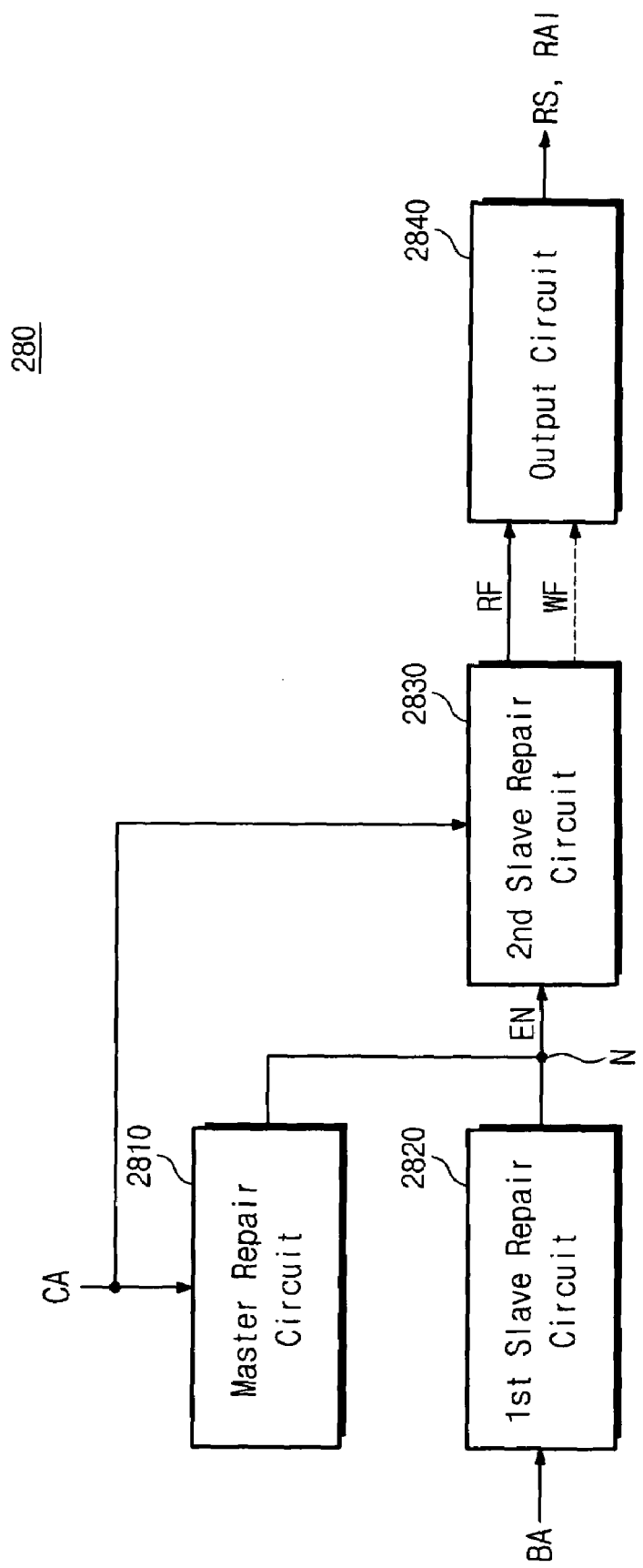
FIG. 5A is a block diagram depicting an example embodiment of a repair control circuit shown in FIGS. 2 and 3.

FIG. 5A is a block diagram depicting an example embodiment of a repair control circuit 280 shown in FIGS. 2 and 3. Referring to FIG. 5A, the repair control circuit 280 includes a master repair circuit 2810, a first slave repair circuit 2820, a second slave repair circuit 2830, and an output circuit 2840.

The master repair circuit 2810 stores information on whether the global bitline for reading GBLR and the global bitline for writing GBLW are repaired into the redundant global bitline for reading RGBLR and a writing redundant global bitline GBLW, respectively. In an example embodiment, the master repair circuit 2810 may include a plurality of fuses each corresponding to each of the reading and writing global bitlines GBLR and GBLW. For example, the master repair circuit 2810 stores information on whether the read and writing global bitlines GBLR and GBLW are repaired, depending on whether the plurality of fuses are cut.

The master repair circuit 2810 externally receives the column address CA. The master repair circuit 2810 activates an active signal EN when a global bitline for reading GBLR and a global bitline for writing GBLW corresponding to the column address CA are repaired into a redundant global bitline for reading RGBLR and a redundant global bitline for writing RGBLW, respectively. The active signal EN is transferred to the second slave repair circuit 2830 through a node N. The master repair circuit 2810 will be described in more detail later with reference to FIG. 5B.

The first slave repair circuit 2820 stores information on whether bitlines (local bitlines or global bitlines) in a specific one of the banks BANK1-BANKm are repaired into redundant bitlines (redundant local bitlines or redundant global bitlines), respectively. In an example embodiment, the first slave repair circuit 2820 may include a plurality of fuses each corresponding to each of the banks BANK1-BANKm. For example, the first slave repair circuit 2820 stores information on whether corresponding bitlines (local bitlines or global bitlines) are repaired into redundant bitlines (redundant local bitlines or redundant global bitlines), depending on whether the plurality of fuses are cut.

The first slave repair circuit 2820 externally receives a bank address BA. When bitlines (local bitlines or global bitlines) of a bank corresponding to the received bank address BA are repaired into redundant bitlines (local redundant bitlines or global redundant bitlines), the first slave repair circuit 2820 activates the active signal EN. The active signal EN is transferred to the second slave repair circuit 2830 through the node N. The first slave repair circuit 2820 will be described in more detail later with reference to FIG. 5C.

The second slave repair circuit 2830 stores information on whether a local bitline is repaired into a redundant local bitline. In an example embodiment, the second slave repair circuit 2830 may include a plurality of fuses. For example, the second slave repair circuit 2830 stores information on whether corresponding local bitlines are repaired, depending on the plurality of fuses are cut.

The second slave repair circuit 2830 externally receives the column address CA and the active signal EN. For example, the second slave repair circuit 2830 receives the active signal EN from the master repair circuit 2810 or the first slave repair circuit 2820. The second slave repair circuit 2830 operates in response to the active signal EN. For example, the fuses of the second slave repair circuit 2830 are activated in response to the active signal EN.

When a local bitline corresponding to the received column address CA is repaired into a redundant local bitline, the second slave repair circuit 2830 activates a read flag RF or a write flag WF. For example, if the received column address CA is an address for a read operation and corresponds to a repaired local bitline, the second slave repair circuit 2830 activates the read flag RF. If the received column address CA is an address for a write operation and corresponds to a repaired local bitline, the second slave repair circuit 2830 activates the write flag WF. The read flag RF and the write flag WF are transferred to the output circuit 2840. The second slave repair circuit 2830 will be described in more detail later with reference to FIG. 5D.

For the convenience of explanation, the read flag RF and the write flag WF are represented by a solid line and a dotted line, respectively. Hereinafter, signal paths associated with an address for a read operation are represented by solid lines and signal paths associated with an address for a write operation are represented by dotted lines.

The output circuit 2840 receives the read flag RF and the write flag WF from the second slave repair circuit 2830. In response to the read flag RF or the write flag WF, the output circuit 2840 activates a control signal RS and a redundant flag signal RAI. In an example embodiment, the output circuit 2840 activates a read control signal RS_R and a read redundant flag signal RAI_R or activates a write control signal RS_W and a write redundant flag signal RAI_W. The output circuit 2840 will be described in more detail later with reference to FIG. 5E.

Figure 5B:
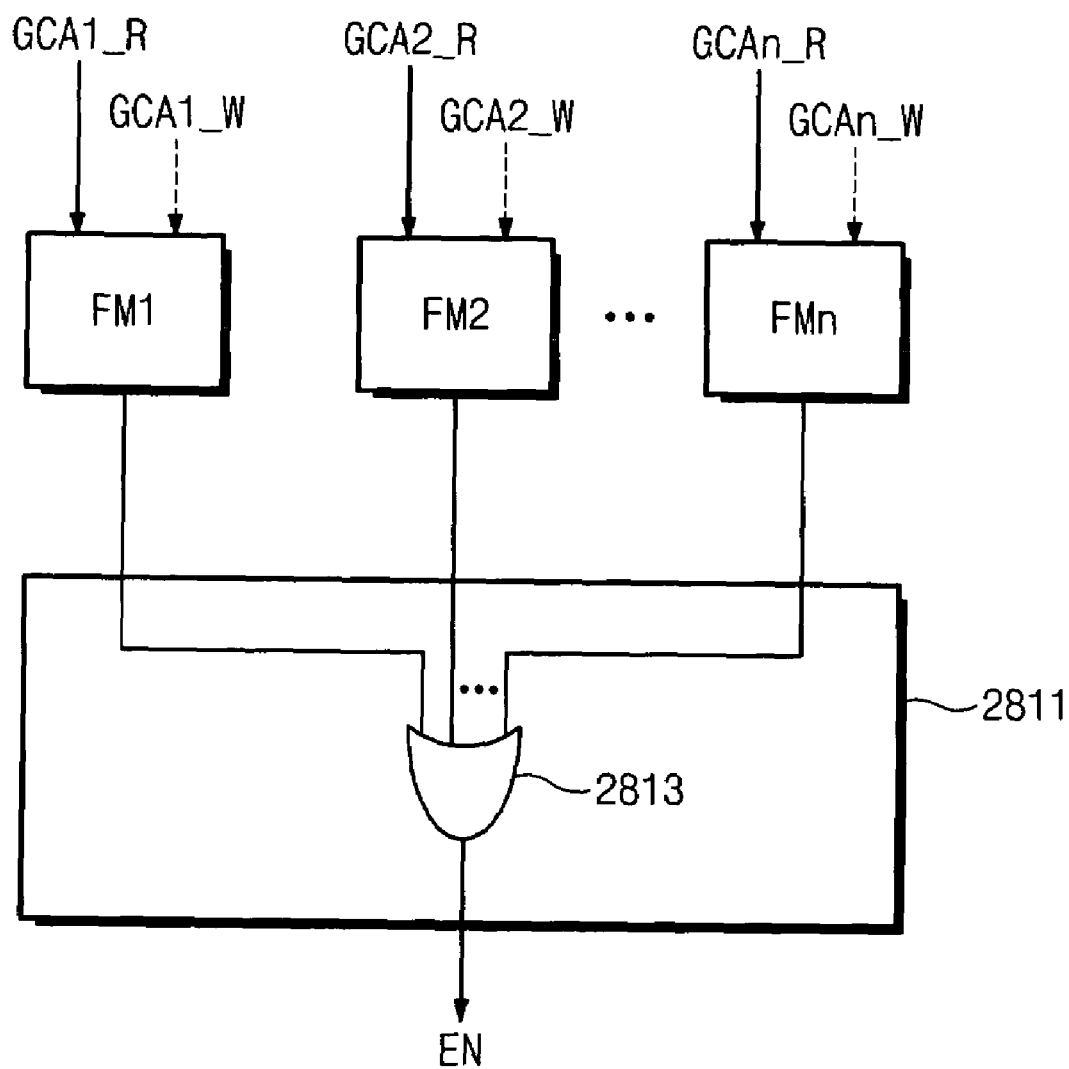
FIG. 5B is a block diagram depicting an example embodiment of a master repair circuit shown in FIG. 5A.

FIG. 5B is a block diagram depicting an example embodiment of a master repair circuit 2810 shown in FIG. 5A. As shown in FIG. 5B, the master repair circuit 2810 includes a plurality of fuse units FM1-FMn and a compare circuit 2811.

The fuse units FM1-FMn correspond to global bitlines for reading GBLR and global bitlines for writing GBLW, respectively. For example, if there are n global bitlines for reading and n global bitlines for writing, there are also n fuse units FM1-FMn. In FIG. 3, it is assumed that the columns of the memory cell array 210 include n address groups AG1-Agn each including one global bitline for reading GBLR and one global bitline for writing GBLW. Therefore, there are n fuse units FM1-FMn shown in FIG. 5B.

A first fuse unit FM1 corresponds to global bitlines for reading GBLR and global bitlines for writing GBLW of first address groups AG1 in banks BANK1-BANKm. For example, when a fuse of the first fuse unit FM1 is cut, the global bitlines for writing GBLR and the global bitlines for reading GBLW of the first address groups AG1 in the banks BANK1-BANKm are repaired into redundant global bitlines for reading RGBLR and redundant global bitlines for writing RGBLW, respectively.

Similarly, an nth fuse unit FMn corresponds to the global bitlines for reading GBLR and global bitlines for writing GBLW of nth address groups AGn in banks BANK1-BANKm. For example, when a fuse of the nth fuse unit FMn is cut, the global bitlines for writing GBLR and the global bitlines for reading GBLW of the nth address groups AGn in the banks BANK1-BANKm are repaired into redundant global bitlines for reading RGBLR and redundant global bitlines for writing RGBLW, respectively.

The fuse units FM1-FMn are configured to operate in response to corresponding addresses GCA1_R-GCAn_R and GCA1_W-GCAn_W, respectively. In an example embodiment, the addresses GCA1_R-GCAn_R are global bitline addresses for reading corresponding to the global bitlines GBLR for reading, and the addresses GCA1_W-GCAn_W are global bitline addresses for writing corresponding to the global bitlines for writing GBLW.

In an example embodiment, the fuse units FM1-FMn may be configured to operate in response to a global bitline address among the received column addresses CA. In another example embodiment, the fuse units FM1-FMn may be configured to receive a global bitline address among the column addresses CA and to operate in response to the received global bitline address.

When an address of a specific global bitline (for reading or writing) is received and a fuse of a fuse unit corresponding to the received address is cut, the corresponding fuse unit outputs a signal indicating that a global bitline (for reading or writing) corresponding to the received address is repaired into a redundant global bitline (for reading or writing). In an example embodiment, when an address of a specific global bitline (for reading or writing) is received and a fuse of a fuse unit corresponding to the received address is cut, a corresponding fuse unit may be configured to output a logic high.

The compare circuit 2811 receives outputs of the fuse units FM1-FMn. When at least one of the fuses FM1-FMn is cut, the compare circuit 2811 is configured to activate an active signal EN. For example, when at least one of the global bitlines for reading and writing GBLR and GBLW is repaired into redundant global bitlines for reading and writing RGBLR and RGBLW, the compare circuit 2811 is configured to active the active signal EN. In an example embodiment, when an output of at least one of the fuse units FM1-FMn is logic high, the compare circuit 2811 activates the active signal EN. As shown in FIG. 5B, the compare circuit includes an OR gate 2813 that receives the outputs of the fuse units FM1-FMn and outputs the active signal EN. While the compare circuit 2811 is described as including one OR gate 2813, the example embodiments are not limited thereto.

Thus, when a global bitline (for reading or writing) corresponding to the received address is repaired into a redundant global bitline (for reading or writing), the master repair circuit 2810 is configured to activate the active signal EN.

Figure 5C:
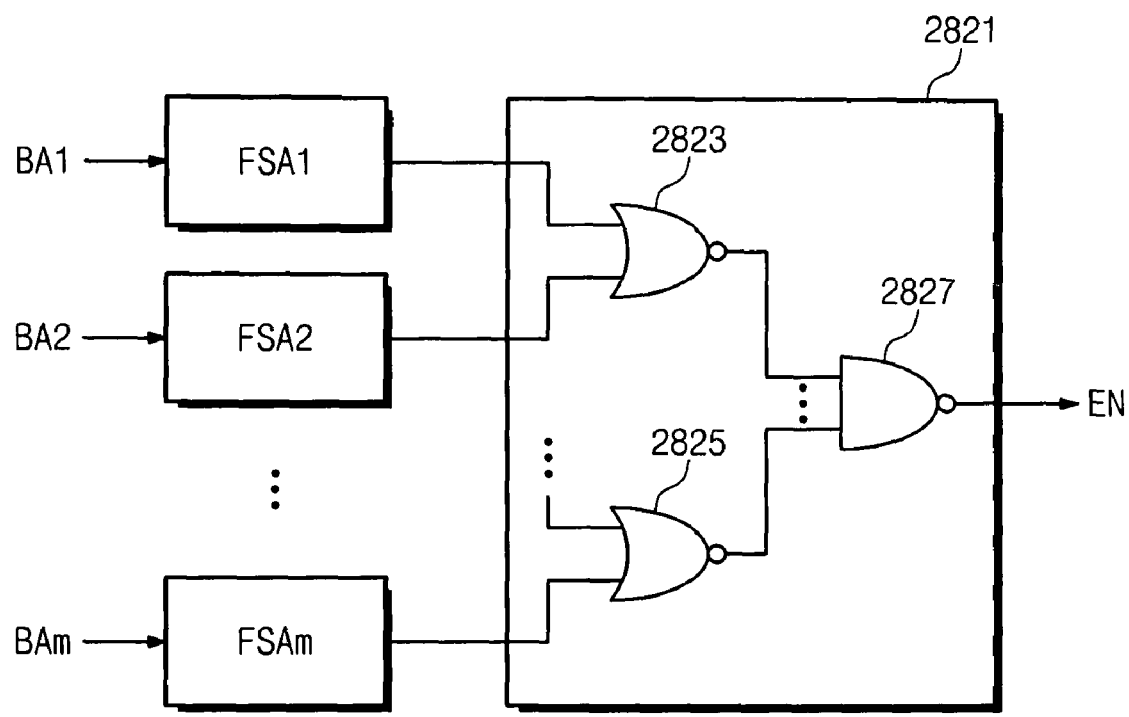
FIG. 5C is a block diagram depicting an example embodiment of a first slave repair circuit shown in FIG. 5A.

FIG. 5C is a block diagram depicting an example embodiment of a first slave repair circuit 2820 shown in FIG. 5A. As shown in FIG. 5C, the first slave repair circuit 2820 includes a plurality of fuse units FSA1-FASm and a compare circuit 2821.

The plurality of fuse units FSA1-FSAm correspond to a plurality of banks BANK1-BANKm, respectively. For example, if there are m banks BANK1-BANKm, there are also m fuse units FSA1-FSAm. In FIG. 3, it is assumed that the memory cell array 210 includes m banks BANK1-BANKm. Accordingly, there are m fuse units FSA1-FSAm.

A first fuse unit FSA1 corresponds to a first bank BANK1. For example, when a fuse of the first fuse unit FSA1 is cut, bitlines (local bitlines or global bitlines) of the first bank BANK1 are repaired into redundant bitlines (redundant local bitlines or redundant global bitlines).

Similarly, an mth fuse unit FSAm corresponds to an mth bank BANKm. For example, if a fuse of the mth fuse unit FSAm, bitlines (local bitlines or global bitlines) of the mth bank BANKm are repaired into redundant bitlines (redundant local bitlines or redundant global bitlines).

In an example embodiment, the plurality of fuse units FSA1-FSAm are configured to operate in response to corresponding bank addresses BA1-Bam, respectively.

When a specific address is received and a fuse of a fuse unit corresponding to the received address is cut, a corresponding fuse unit outputs a signal indicating that at least one of bitlines (local bitlines or global bitlines) of a bank corresponding to the received address is repaired into a redundant bitline (a redundant local bitline or a redundant global bitline). In an example embodiment, when a fuse of a specific fuse unit is cut, a corresponding fuse unit is configured to output logic high.

The compare circuit 2821 receives outputs of the fuse units FSA1-FSAm. When at least one of the fuse units FSA1-FSAm is cut, the compare circuit 2821 is configured to active the active signal EN.

For example, when at least one of the bitlines (local bitlines or global bitlines) of a bank corresponding to the received bank address is repaired, the compare circuit 2821 is configured to activate the active signal EN. In an example embodiment, if at least one output of the fuse units FSA1-FSAm is high, the compare circuit 2821 activates the active signal EN.

For example, when at least one of the bitlines (local bitlines or global bitlines) of a bank corresponding to the received bank address is repaired, the first slave repair circuit 2820 is configured to activate the active signal EN.

The compare circuit 2821 includes at least two NOR gates two NOR gates 2823 and 2825 receiving the outputs of the fuse units FSA1-FSAm and a NAND gate 2827 receiving the outputs of the at the at least two NAND gates 2827, where the NAND gates outputs the active signal EN. While the compare circuit 2821 is described as including two NOR gates 2823 and 2825 and one NAND gate 2827, example embodiments are not limited thereto.

Figure 5D:
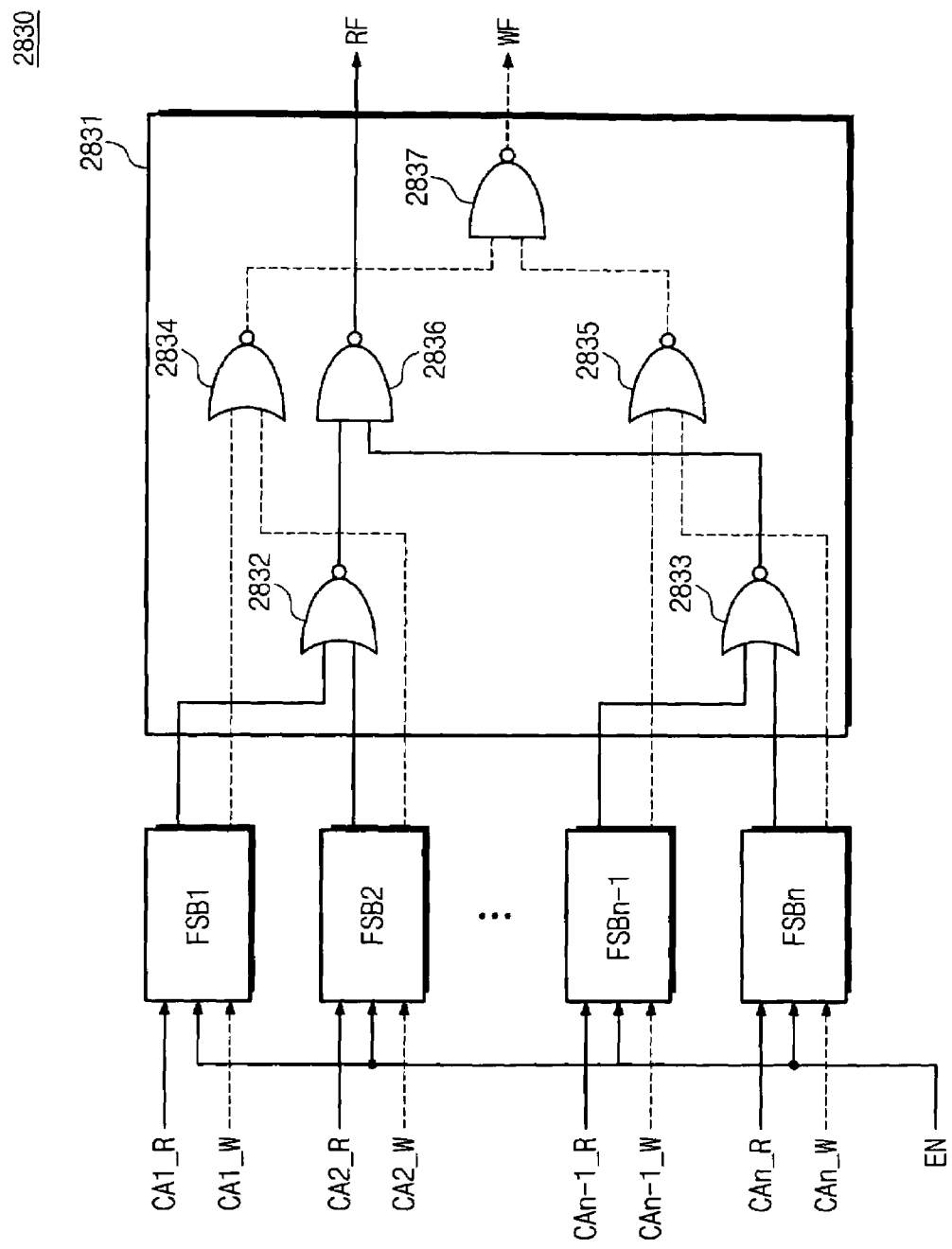
FIG. 5D is a block diagram depicting an example embodiment of a second slave repair circuit shown in FIG. 5A.

FIG. 5D is a block diagram depicting an example embodiment of a second slave repair circuit 2830 shown in FIG. 5A. As shown in FIG. 5D, the second slave repair circuit 2830 includes a plurality of fuse units FSB1-FSBn and a compare circuit 2831. For the convenience of explanation, there is shown a second slave repair circuit 2830 corresponding to address groups AG1-AGn of only one (e.g., BANKM) of the banks BANK1-BANKm in the memory cell array shown in FIG. 3.

The fuse units FSB1-FSBn correspond to the address groups AG1-AGn of the bank BANKm, respectively. For example, if there are n address groups AG1-AGn, there are also n fuse units FSB1-FSBn. In FIG. 3, it is assumed that the memory cell array 210 includes n address groups AG1-AGn. Accordingly, there are n fuse units FSB1-FSBn shown in FIG. 5D.

A first fuse unit FSB1 corresponds to a first address group AG1 of an mth bank BANKm and receives the active signal EN from the node N. For example, when a fuse of the first fuse unit FSB1 is cut, local bitlines of the first address group AG1 of the mth bank BANKm are repaired into redundant local bitlines, respectively.

Similarly, an nth fuse FSBn corresponds to an nth address group AGn of the mth bank BANKM and receives the active signal EN from the node N. For example, when a fuse of the nth fuse unit FSBn is cut, local bitlines of the nth address group AGn of the mth bank BANKm are repaired into redundant local bitlines, respectively.

In an example embodiment, each of the fuse units FSB1-FSBn may be configured to operate in response to a corresponding column address for reading CAn_R, a corresponding column address for writing CAn_W, and the active signal EN. In an example embodiment, a column address for reading CAn_R and a column address for writing CAn_W may be addresses corresponding to the address groups AG1-AGn.

When an address CAn of a specific address group AGn is received and the active signal EN is activated (such as a logic high), a fuse of a fuse unit FSBn corresponding to the received address is cut and the corresponding fuse unit outputs a signal indicating that local bitlines of the address group AGn corresponding to the received address CAn are repaired in to redundant local bitlines, respectively. For example, when a fuse of a specific fuse unit is cut, a corresponding fuse unit is configured to output logic high.

In an example embodiment, when a column address for reading CAn_R of a specific address group is received and the active signal EN is activated, a corresponding fuse unit is configured to output logic high as an output for reading. When a column address for writing of the specific address group is received and the active signal EN is activated, a corresponding fuse unit is configured to output logic high for writing.

The compare circuit 2831 receives outputs of the fuse units FSB1-FSBn. When at least one fuse of the fuse units FSB1-FSBn is cut, the compare circuit 2831 is configured to activate a read flag RF or a write flag WF.

For example, when local bitlines of the address group AGn corresponding to the column address for reading or writing CAn_R or CAn_W are repaired, the compare circuit 2831 is configured to activate the read flag RF or the write flag WF. For example, when at least one output for reading of the fuse units FSB1-FSBn is high, the compare circuit 2831 activates the read flag RF, and when at least one output for writing of the fuse units FSB1-FSBn is high, the compare circuit 2831 activates the write flag WF.

For example, when local bitlines of the address group AGn corresponding to the received column address for reading or writing CAn_R or CAn_W are repaired into local bitlines, the second slave repair circuit 2830 is configured to activate the corresponding read flag RF or write flag WF.

For example, as shown in FIG. 5D, the outputs for reading of the fuses FSB1-FSBn are transferred to NOR gates 2832 and 2833 and outputs of the NOR gates 2832 and 2833 are transferred to a NAND gate 2836, where the NAND gate 2836 outputs the read flag RF. It is also shown that outputs for writing of the fuses FSB1-FSBn are transferred to NOR gates 2834 and 2835 and outputs of the NOR gates 2834 and 2835 are transferred to a NAND gate 2837, where the NAND gate 2837 outputs the write flag WF. While the compare circuit 2831 is described as including the NOR gates 2832, 2833, 2834, and 2835 and NAND gates 2836 and 2837, example embodiments are not limited thereto.

Figure 5E:
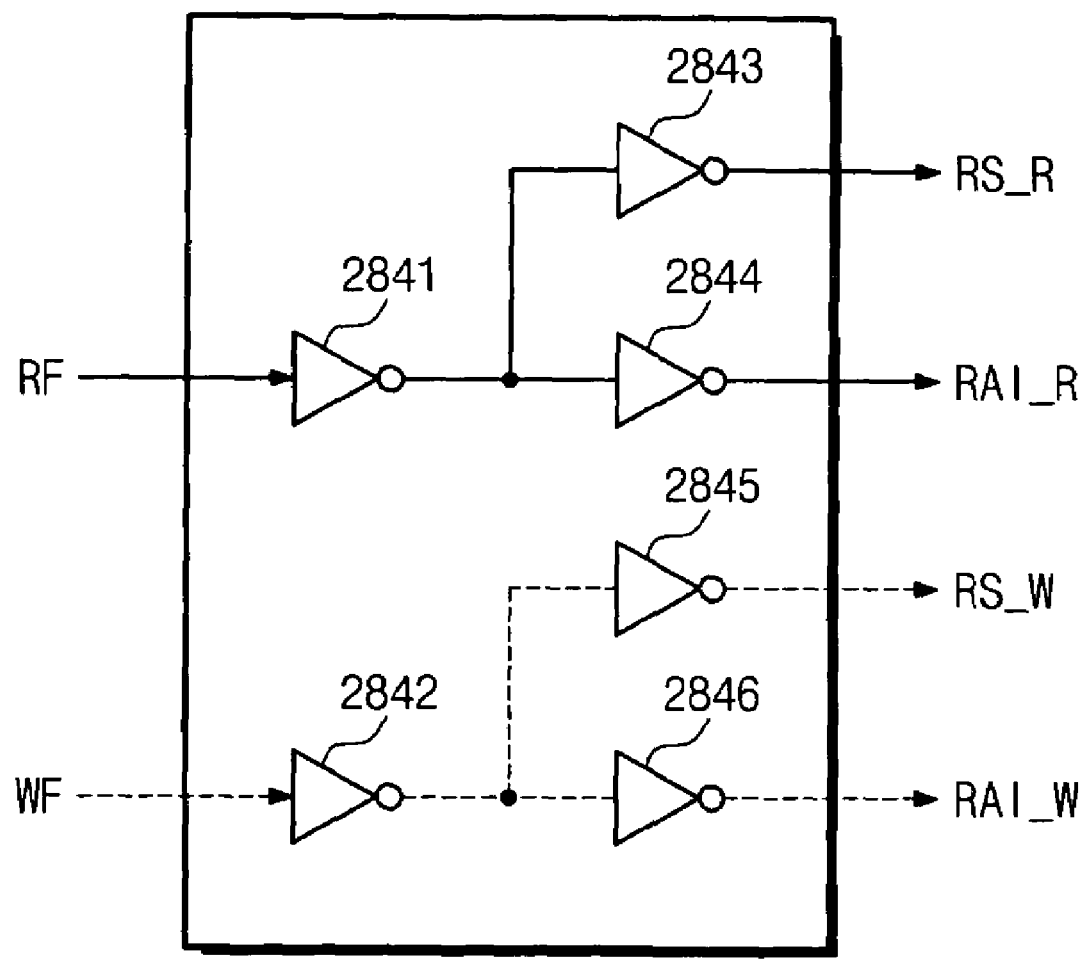
FIG. 5E is a diagram depicting an example embodiment of an output circuit shown in FIG. 5A.

FIG. 5E is a diagram depicting an example embodiment of an output circuit 2840 shown in FIG. 5A. Referring to FIG. 5E, the output circuit 2840 is configured to receive the read flag RF and the write flag WF. When receiving the read flag RF, the output circuit 2840 activates a control signal for reading RS_R and a redundant flag signal for reading RAI_R.

The control signal for reading RS_R is transferred to the column selector 220. In response to the control signal for reading RS_R, the column selector 220 selects a redundant global bitline for reading RGBLR and a redundant local bitline. The redundant flag signal for reading RAI_R is transferred to the multiplexer 240. In response to the redundant flag signal for reading RAI_R, the multiplexer 240 is configured to select a redundant sense amplifier and a write driver 224. In an example embodiment, the multiplexer 240 is configured to select a redundant sense amplifier in response to the redundant flag signal for reading RAI_R.

When receiving the write flag WF, the output circuit 2840 activates a control signal for writing $RS_{13}W$ and a redundant flag signal for writing RAI_W. The control signal for writing RS_W is transferred to the column selector 220. In response to the control signal for writing RS_W, the column selector 220 selects a redundant global bitline for writing RGBLW and a redundant local bitline. The redundant flag signal for writing RAI_W is transferred to the multiplexer 240. In response to the redundant flag signal for writing RAI_W, the multiplexer 240 is configured to select a redundant sense amplifier and a writer driver 224. In an example embodiment, the multiplexer 240 is configured to select a redundant writer driver in response to the redundant flag signal RAI_W.

As illustrated in FIG. 5E, the output circuit 2840 includes a plurality of inverters 2841-2846. The read flag RF is transferred to the inverter 2841. An output of the inverter 2841 is output through the inverters 2843 and 2844 as a control signal for reading RS_R and a redundant flag signal for reading RAI_R. The write flag WF is transferred to the inverter 2842. An output of the inverter 2842 is output through the inverters 2845 and 2846 as a control signal RS_W for writing and a redundant flag signal for writing RAI_W. While the output circuit 2840 is described as including the inverters 2841-2846, example embodiments are not limited thereto.

As described above, when bitlines (local bitlines or global bitlines) of a bank corresponding to the received bank address BA are repaired, the active signal EN is activated. When bitlines (local bitlines or global bitlines) of an address group AG corresponding to the received column address CA are repaired, the control signal RS and the redundant flag signal RAI are activated. Thus, a repair operation may be performed by unit of an address group AG of each bank.

When a fuse of the master repair circuit 2810 is cut, the active signal EN is activated irrespective of the received bank address BA. Accordingly, when the global bitlines for reading and writing GBLR and GBLW are repaired, a repair operation is performed by cutting one fuse of the master repair circuit 2810 instead of cutting fuses of the first slave repair circuit 2820. Although loss of a peripheral circuit may result from fuse cutting, fuse cutting time and the loss of a peripheral circuit may be reduced due to the repair operation.

In an example embodiment, fuses of the repair control circuit 280 may be made of polysilicon and may be laser fuses cut by laser. In another example embodiment, the fuses of the repair control circuit 280 may be electric fuses. For example, each fuse may include a switching means (e.g., a transistor) and a latch controlling the switching means. Data stored in the latch to control the switching means is stored nonvolatilely. For example, the data stored in the latch to control the switching means is stored in a memory cell array and read during a power-on reset operation to be stored in a latch.

In an example embodiment, the fuses of the repair control circuit 280 may include nonvolatile memory cells. In this case, an erased nonvolatile memory cell may have a lower threshold voltage than a reference voltage and a programmed nonvolatile memory cell may have a higher threshold voltage than the reference voltage. According to a threshold voltage of the nonvolatile memory cell, it is determined whether a fuse is cut. The nonvolatile memory cells may be, for example, a flash memory cell, a phase change memory cell, and a magnetoresistive memory cell.

As set forth above, the fuse units FSB1-FSBn of the second slave repair circuit 2830 correspond to the address groups AG1-AGn, respectively. Each fuse unit (e.g., FSBn) may include a plurality of fuses each corresponding to each of local bitlines of a corresponding address group AGn. A column address CA corresponding to local wordlines may be provided to each fuse unit FSBn. Depending on whether the fuses of the fuse unit FSBn are cut, it may be indicated whether local wordlines of the corresponding address group AGn are repaired. Thus, the repair control circuit 280 may be configured to perform a repair operation by unit of a local wordline.

Figure 6:
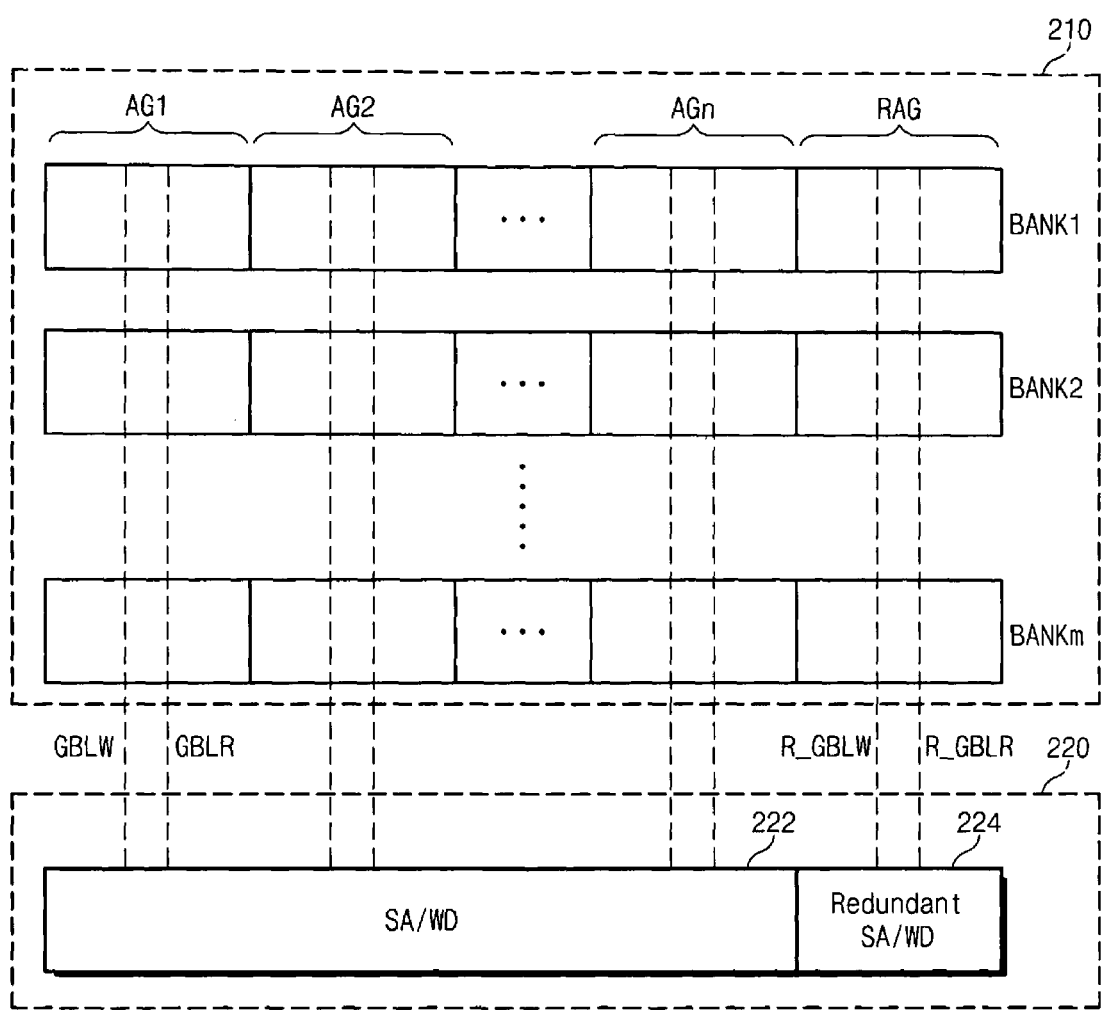
FIGS. 6 to 9 are block diagrams depicting a repairing method according to an example embodiment of the present invention.

FIGS. 6 to 9 are block diagrams depicting a repairing method according to an example embodiment of the present invention. Referring to FIG. 6, a memory cell array 210 and a sense amplifier/write driver circuit 220 are depicted.

The memory cell array 210 includes a plurality of memory banks BANK1 to BANKm. Each of the memory banks BANK includes a plurality of address groups AG1 to AGn and a redundant address group RAG. The respective address groups AG are connected to the plurality of local bitlines LBL (not shown). The local bitlines of the respective address groups AG are connected to the global bitlines for reading and writing GBLR and GBLW. The respective redundant address groups RAG are connected to the plurality of redundant local bitlines (not shown). The redundant local bitlines of the respective redundant address groups RAG are connected to the redundant global bitlines for reading and writing R_GBLR and R_GBLW. The address groups AG located in the same column are connected to the same global bitlines for reading and writing GBLR and GBLW.

The sense amplifier/write driver circuit 220 includes a sense amplifier/write driver 222 and a redundant sense amplifier/write driver 224. The global bitlines for reading and writing GBLR and GBLW are connected to the sense amplifier/write driver circuit 222. The redundant global bitlines for reading and writing GBLR and GBLW are connected to the redundant sense amplifier/write driver circuit 224.

Figure 7:
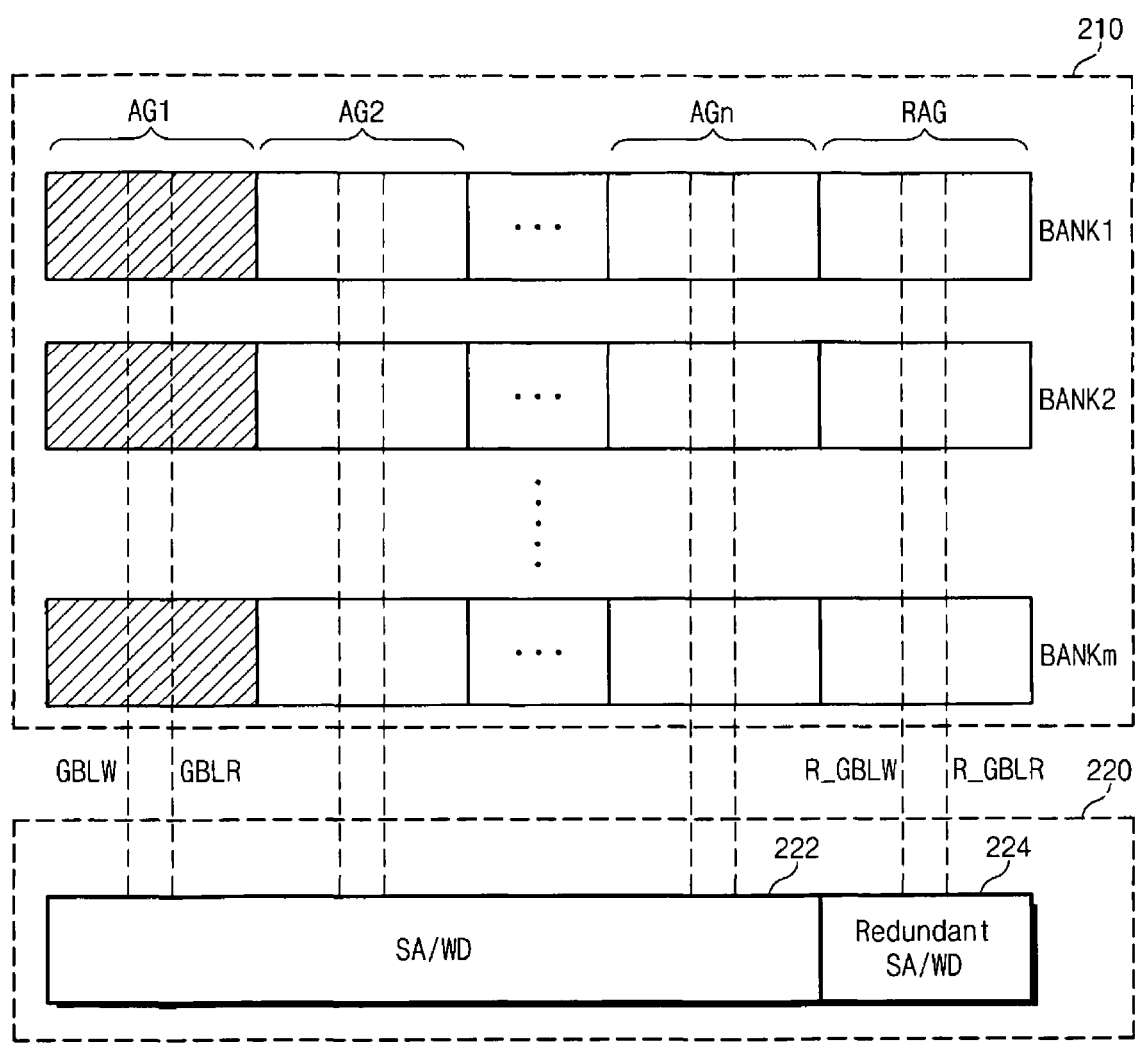

Referring to FIG. 7, a test is performed on the portions shaded in slanted lines. For example, tests are performed on the address groups AG1 of the banks BANK1 to BANKm. The test is performed by performing the reading, writing and erase operations repeatedly. When a defect is detected in the phase change memory cells connected to the local bitlines LBL, or a defect is detected in the local bitlines LBL, the local bitlines LBL are repaired into redundant local bitlines by the repair control circuit 280.

When a defect is detected in the global bitlines for reading and writing GBLR and GBLW, the global bitlines for reading and writing GBLR and GBLW are repaired into redundant global bitlines for reading and writing GBLR and GBLW by the repair control circuit 280.

In order to describe an operation of an example embodiment of the present invention, it is assumed that a defect has occurred in the phase change memory cells connected to the local bitlines LBL of the address group AG2 of the BANK2, or a defect has occurred in the local bitlines LBL of the address group AG2.

Figure 8:
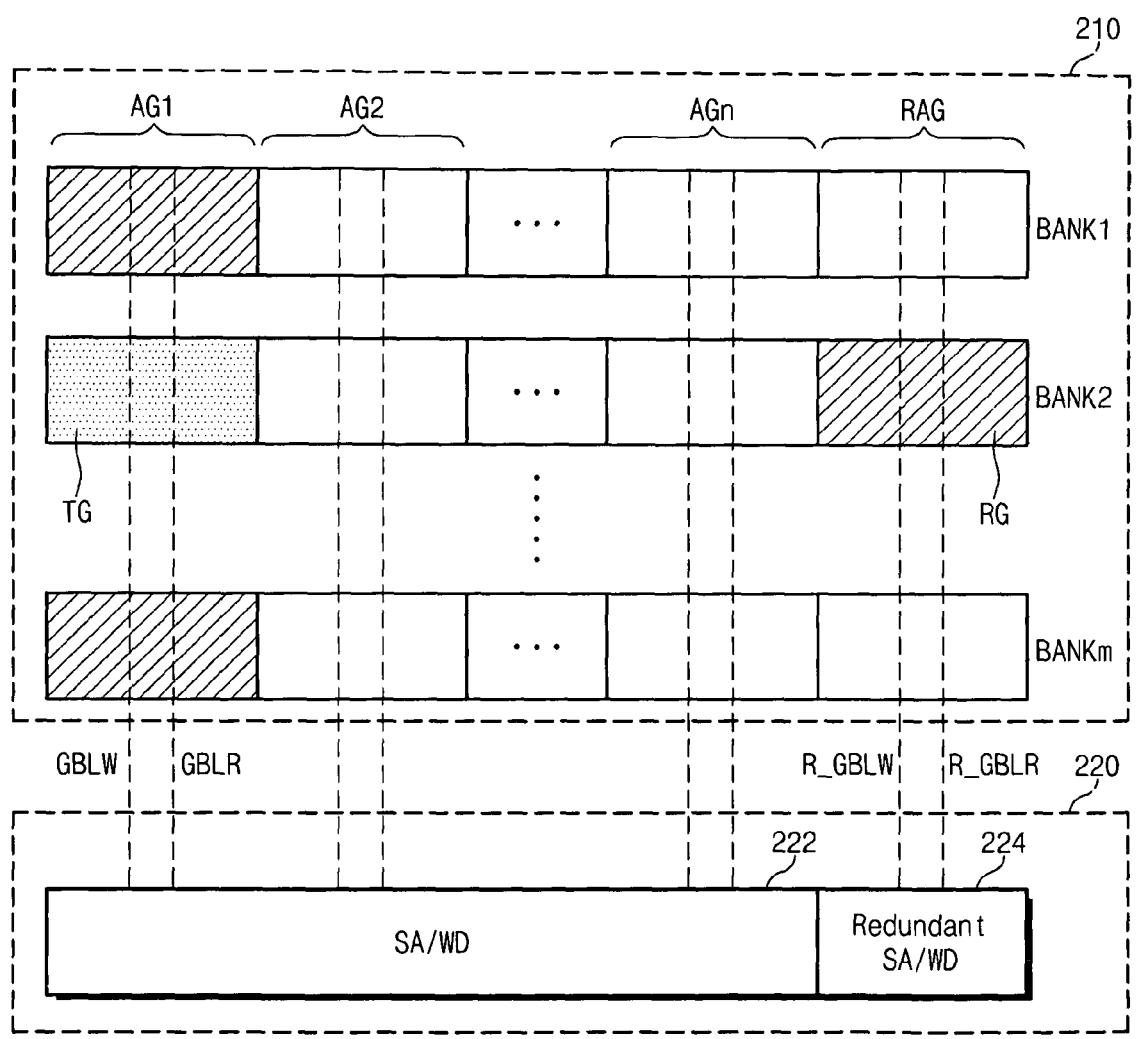

Referring to FIG. 8, memory cells TG of the address group AG1 of the BANK2 are repaired into memory cells RG of the redundant address group RAG of the BANK2. Thus, the local bitlines LBL connected to the address group AG1 of the BANK2 are repaired into local bitlines of the redundant address group RAG. Afterwards, when the address for accessing the address group AG1 of the BANK2 is transmitted, the redundant address group RAG of the BANK2 may be selected instead of the address group AG1 of the BANK2.

In order to describe an operation of an example embodiment of the present invention in detail, it is assumed that a defect has occurred in the global bitlines for reading and writing GBLR and GBLW connected to the address groups AG1 of the banks BANK1 to BANKM.

Figure 9:
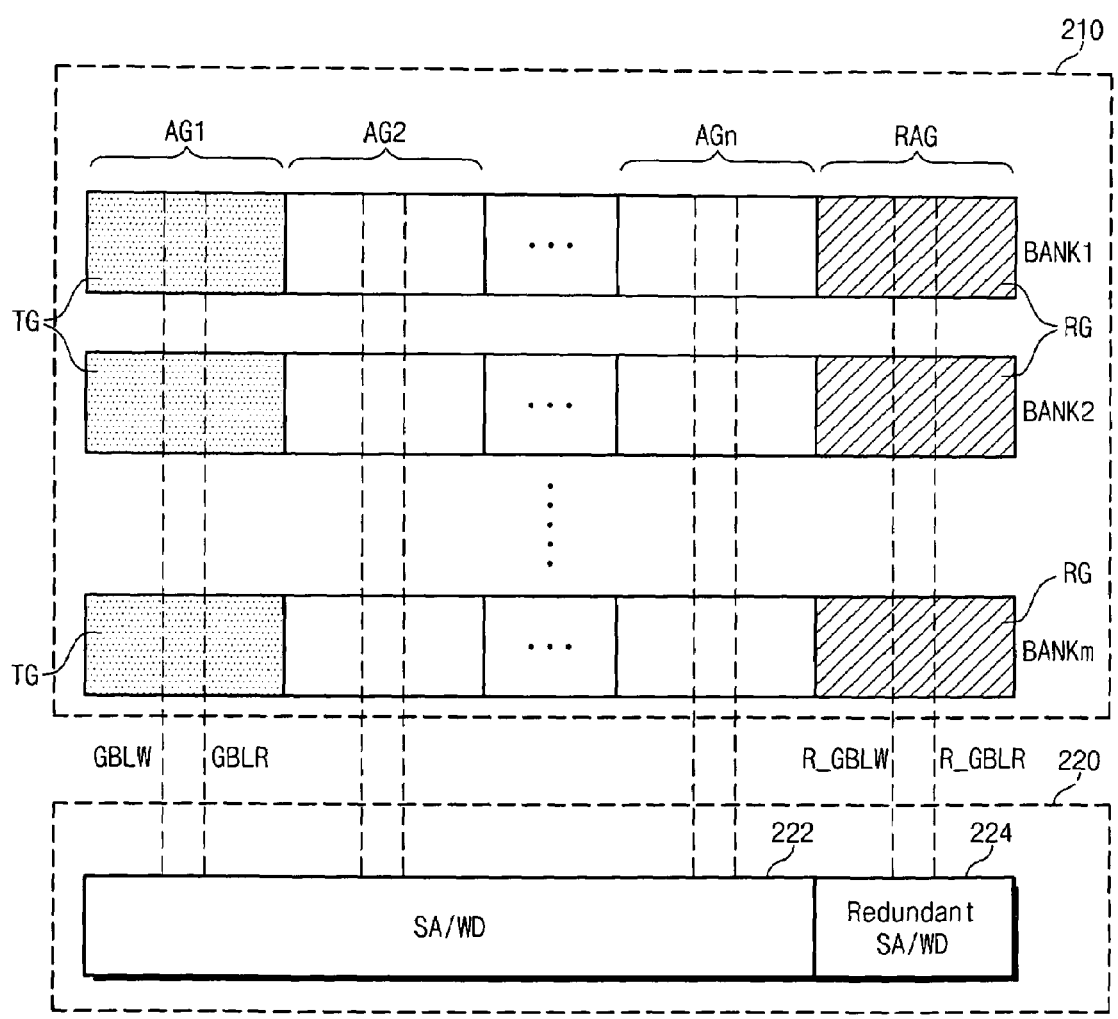

Referring to FIG. 9, memory cells TG of the address groups AG1 of the banks BANK1 to BANKM are repaired into memory cells RG of the redundant address groups RAG. Thus, the global bitlines for reading and writing GBLR and GBLW connected to the address groups AG1 of the banks BANK1 to BANKm are repaired into redundant global bitlines for reading and writing GBLR and GBLW. Afterwards, when the address for accessing the address groups AG1 of the banks BANK1 to BANKm is transmitted, redundant address groups RAG are selected instead of the address groups AG1 of the banks BANK1 to BANKm.

As described above, the phase change memory device according to an example embodiment of the present invention repairs one of the local bitline or the global bitline. If a defect occurs in memory cells connected to a local bitline, or a defect occurs in the local bitline, the local bitline is repaired. If a defect occurs in memory cells connected to local bitlines of a plurality of banks, or a defect occurs in global bitline, the global bitline is repaired. Thus, redundancy efficiency may be improved.

In the above-described example embodiment, it is described that local bitlines connected to one address group AG are repaired into redundant local bitlines connected to a redundant address group RAG. However, an example embodiment of the present invention may be modified or applied into various forms. For example, the local bitlines connected to one address group AG may be repaired individually. Thus, a repair may, for example, be performed in three units of the global bitline, local bitlines connected to one address group, and the respective local bitlines.

The example embodiment of the present invention is described so that the local conductor line and the global conductor line are a local bitline and a global bitline, respectively. However, according to another example embodiment of the present invention, the local conductor line and the global conductor line may be a local wordline and a global wordline, respectively.

Figure 10:
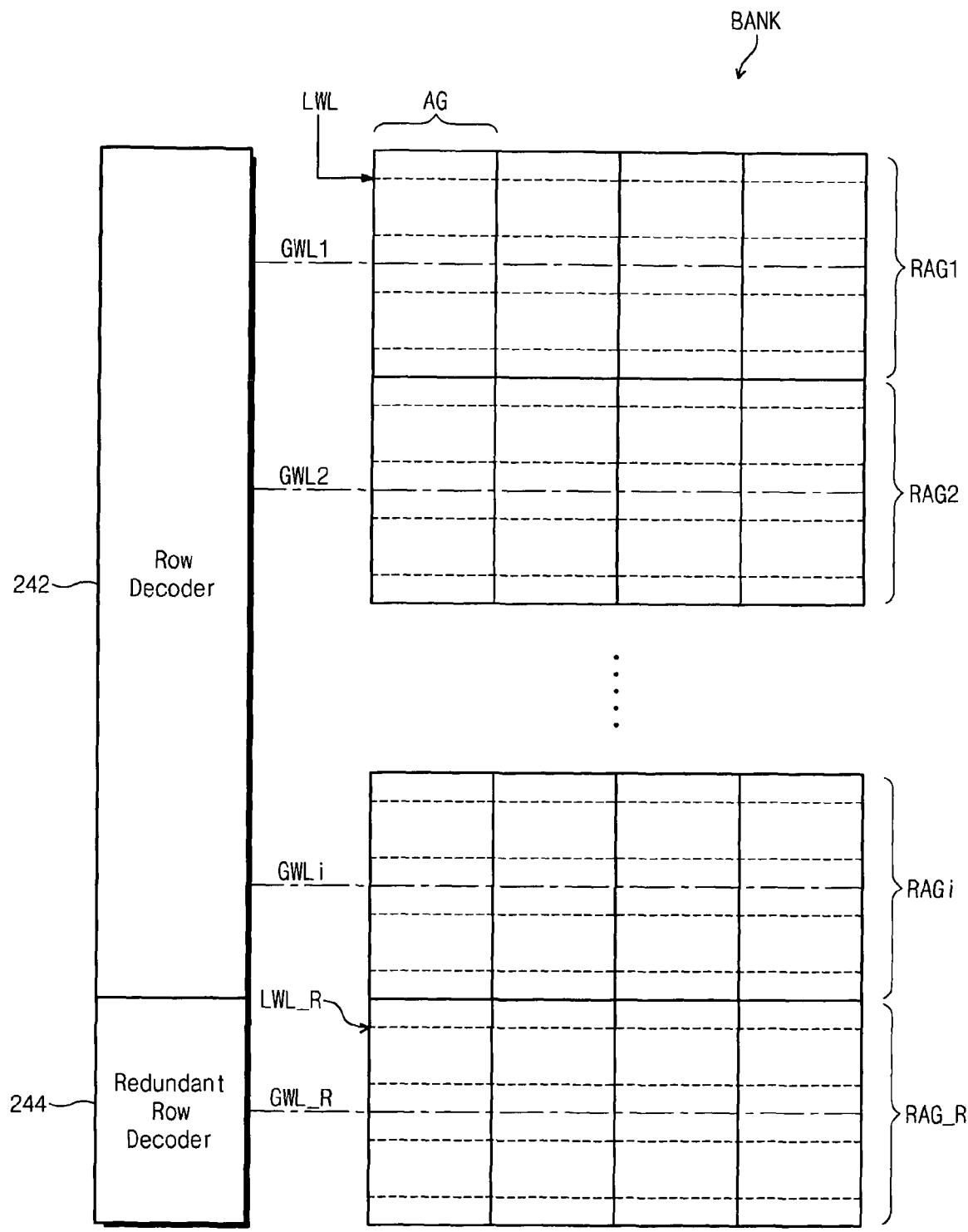
FIG. 10 is a block diagram depicting one of the memory banks of FIG. 3.

FIG. 10 is a block diagram depicting one of the memory banks BANK of FIG. 3. Referring to FIG. 10, the memory bank BANK consists of address groups AG arranged in a row direction. In FIG. 10, the memory bank BANK is drawn as including four address groups AG. However, the number of address groups AG of the memory bank BANK may be more than or less than four. As the address groups AG have already been described in detail with reference to FIGS. 6 to 9, further description will be omitted for brevity. The memory bank BANK consists of a plurality of row address groups RAG1 to RAGi and a redundant row address group RAG_R. The respective row address groups RAG are connected to a plurality of local wordlines LWL.

In FIG. 10, the respective row address groups RAG are connected to four local wordlines LWL. However, the number of local wordlines LWL connected to the respective row address groups RAG may be more than or less than four. Each of the row address groups RAG and the local wordlines LWL are connected to one global wordline GWL. Thus, one or more global wordlines GWL are provided for one memory bank BANK.

The row address groups RAG1 to RAGi are connected to a row decoder 242 via the global wordlines GWL1 to GWLi, and the redundant row address group RAG_R is connected a redundant row decoder 244 via a redundant global wordline GWL_R.

The result on which one of the local wordlines LWL or the global wordlines GWL1 to GWLi of the row address groups RAG1 to RAGi is repaired, is stored in a repair control circuit (not shown). The repair control circuit may be configured in a similar way as the repair control circuit 280 depicted in FIG. 5a. For example, the repair control circuit may receive a row address. If the received row address indicates a repaired local wordline LWL or a repaired global wordline GWL, the repair control circuit may activate a control signal that activates the redundant row decoder 244.

Figure 11:
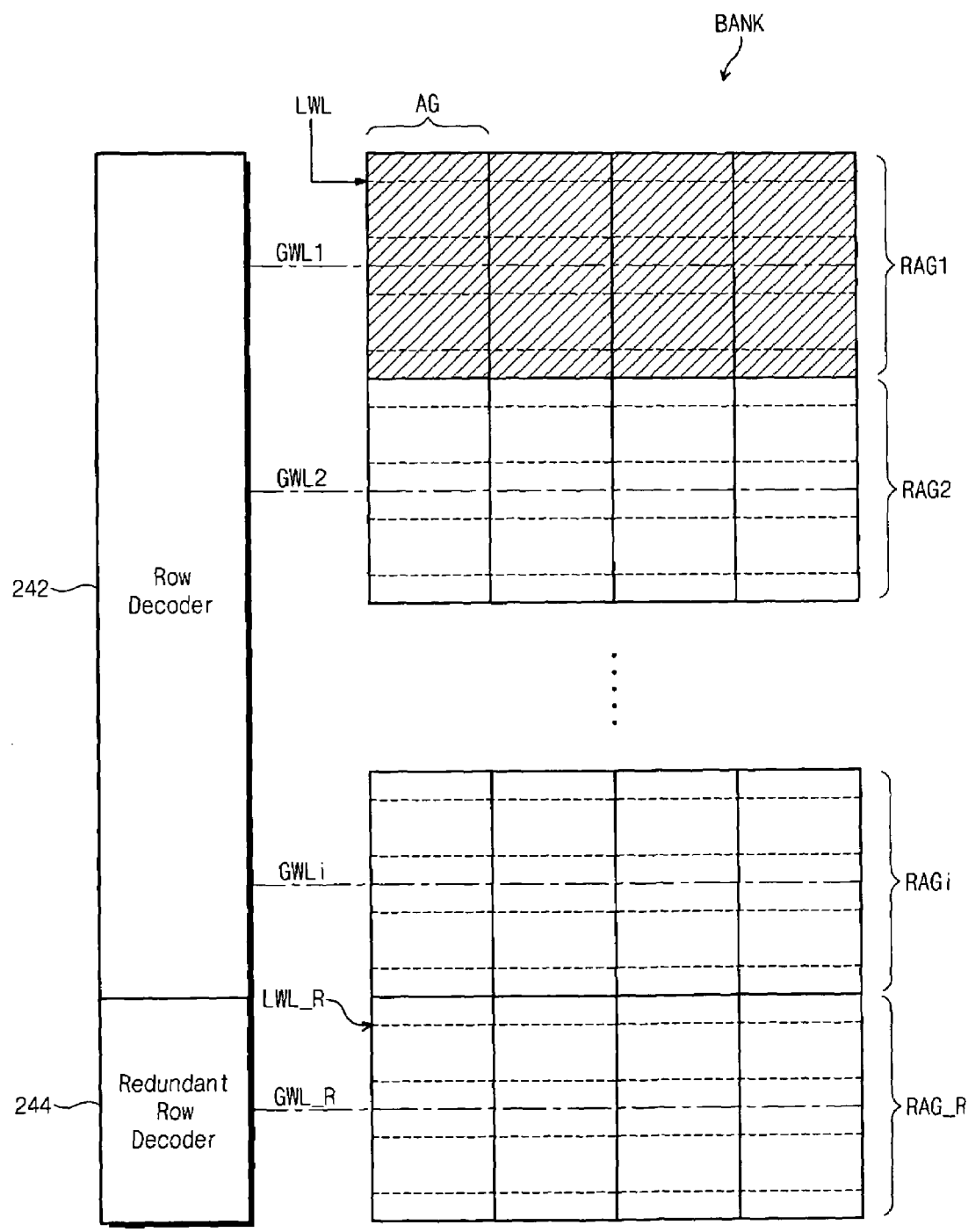
FIGS. 11 to 13 are block diagrams depicting another repairing method according to an example embodiment of the present invention.
Figure 12:
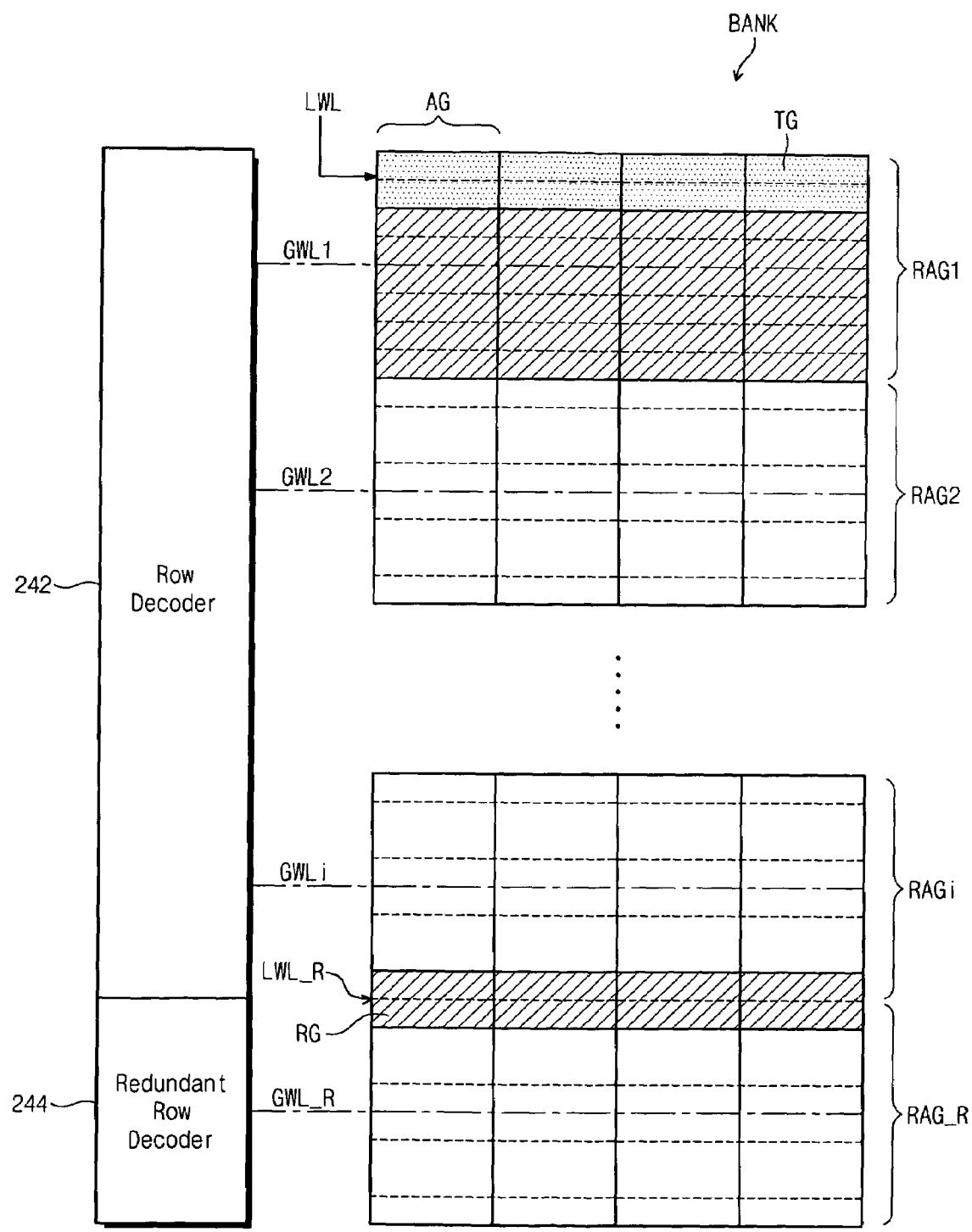
Figure 13:
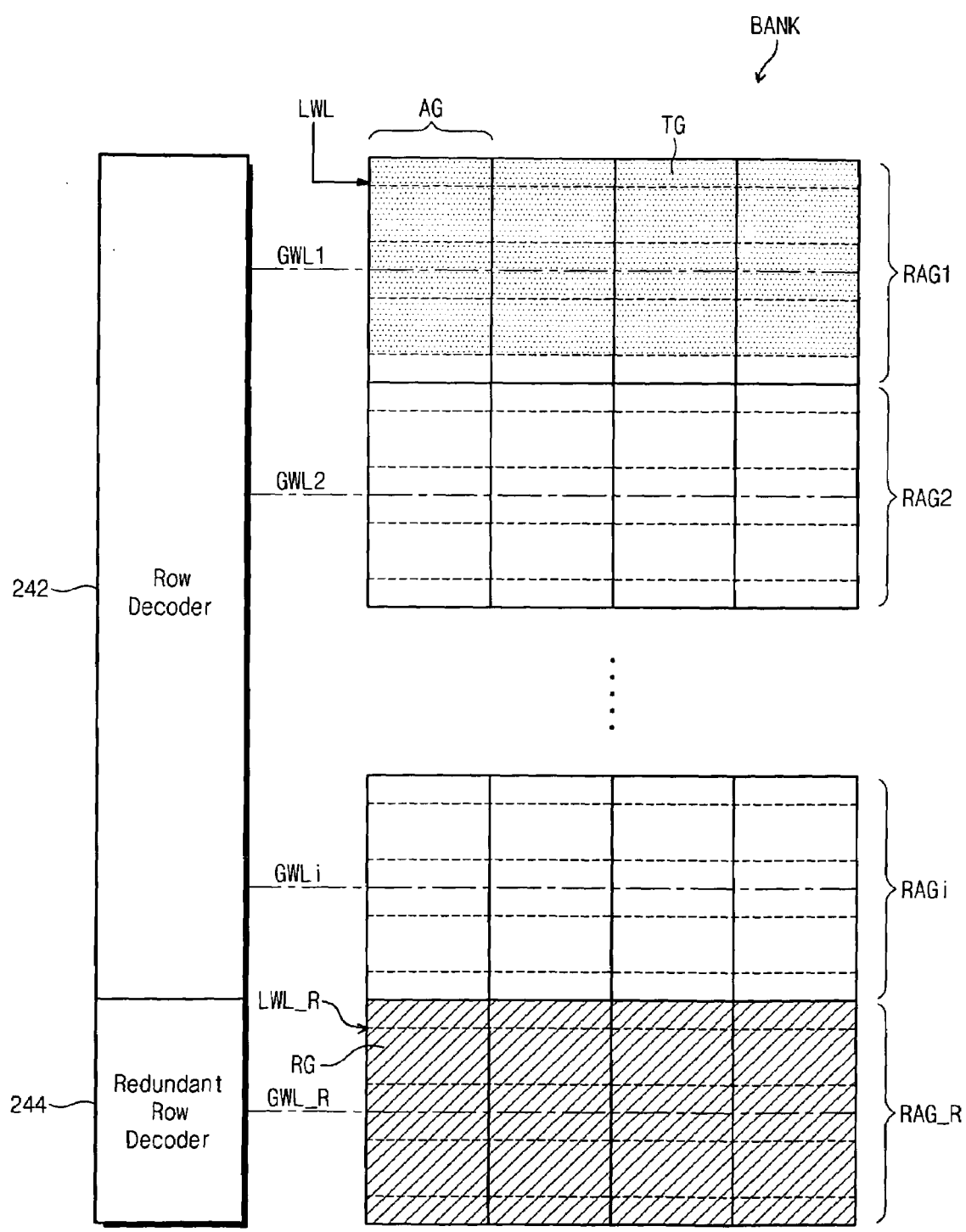

FIG. 11 to FIG. 13 are block diagrams depicting another repairing method according to an example embodiment of the present invention. Referring to FIG. 1, tests are performed on a global wordline GWL1, local wordlines LWL, and phase change memory cells MC. The tests are done by performing reading, writing, and erase operations repeatedly.

In order to describe an operation of an example embodiment of the present invention, it is assumed that a defect has occurred in the phase change memory cells MC connected to a local wordline LWL of a row address group RAG1, and/or a defect has occurred in a local wordline LWL of a row address group RAG1 of FIG. 11.

Referring to FIG. 12, memory cells TG connected to a defective local wordline LWL of the row address group RAG1 are repaired into memory cells RG connected to a redundant local wordline LWL_R of a redundant row address group RAG_R. Afterwards, when an address that accesses the defective local wordline LWL of the row address group RAG1 is transmitted, a redundant local wordline LWL_R of the redundant row address group RAG_R is selected instead of the defective local wordline LWL of the row address group RAG1.

In order to describe an example embodiment of the present invention, it is assumed that a defect has occurred in a global wordline GWL1 of the row address group RAG1 of FIG. 13.

Referring to FIG. 13, memory cells TG connected to a defective global wordline GWL1 of a row address group RAG1 are repaired into memory cells RG connected to a redundant global wordline GWL_R of a redundant row address group RAG_R. Subsequently, when an address for accessing the row address group RAG1 is transmitted, the redundant row address group RAG_R is selected instead of the row address group RAG1.

According to an example embodiment of the present invention, one of the local wordline LWL or global wordline GWL is repaired. If there are relatively less defective cells or a defect occurs in a local wordline LWL, the local wordline LWL is repaired. If there are more defective cells or a defect occurs in the global wordline GWL, the global wordline GWL is repaired. Accordingly, redundancy efficiency is improved.

In the above-described example embodiment, the memory bank BANK is described as including one redundant row address group RAG_R. However, the number of the redundant row address group RAG_R of the memory bank BANK according to an example embodiment of the present invention is unlimited.

In the above described example embodiment, when repairing a local wordline LWL, it is described that the local wordlines LWL are repaired in units of rows of row address group RAG of the memory bank BANK. However, as described with reference to FIG. 4, a local row decoder is arranged in units address groups AG. Thus, the local wordlines LWL are divided and disposed in units of address groups AG. Therefore, the repairing operation of the local wordline LWL of the phase change memory device according to an example embodiment of the present invention may be performed in units of address group AG.

It is also described that the phase change memory device repairs bitlines and wordlines. However, the phase change memory device according to an example embodiment of the present invention may have a repairing means for the bitlines and wordlines, and may selectively perform repairing on the bitlines and wordlines.

Figure 14:
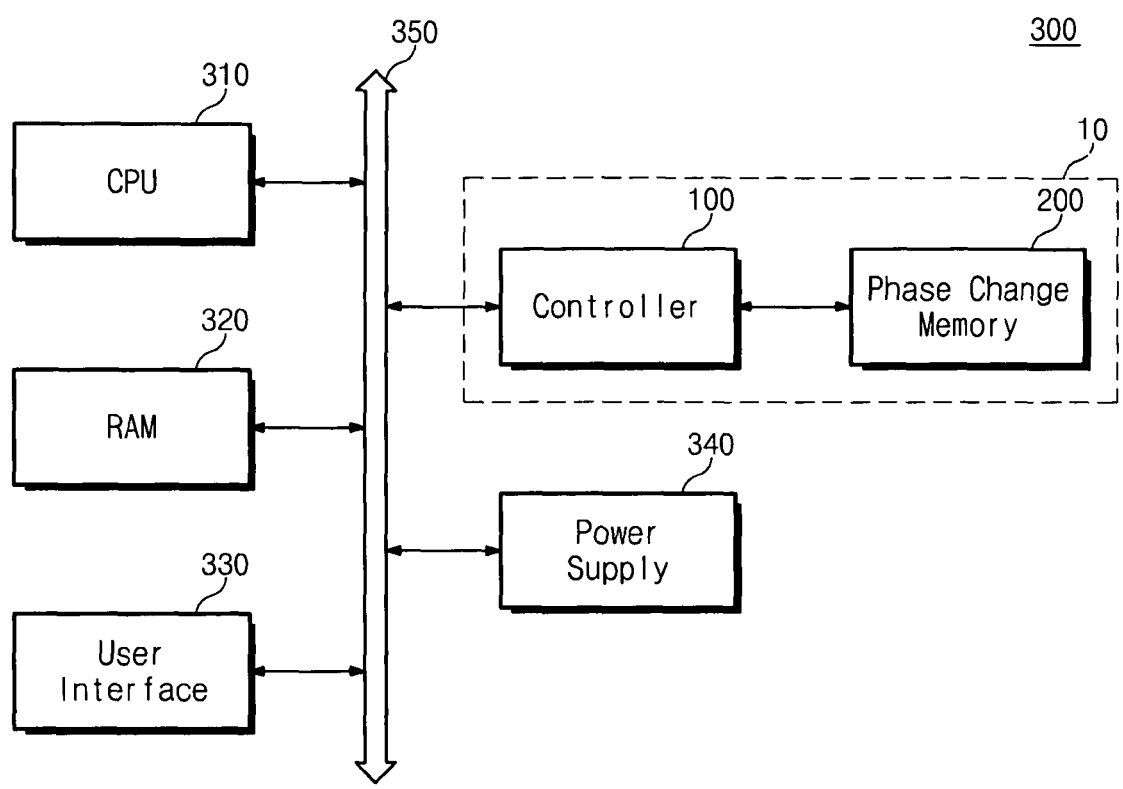
FIG. 14 is a block diagram depicting a computing system that includes the memory system of FIG. 1.

FIG. 14 is a block diagram depicting a computing system 300 that includes the memory system 10 of FIG. 1. Referring to FIG. 14, the computing system 300 according to an example embodiment of the present invention includes a CPU 310, a random access memory (RAM) 320, a user interface 330, a power supply 340, a system bus 350, and a memory system 10.

The memory system 10 is electrically connected to the CPU 310, RAM 320, user interface 330, and power supply 340 via the system bus 350. Data provided through the user interface 330, and processed by the CPU 310 is stored in the memory system 10. The memory system 10 includes a controller 100 and a phase change memory device 200. In the drawing, the phase change memory device 200 is connected to the system bus 350 through the controller 100. However, in another example embodiment, the phase change memory device 200 may be directly connected to the system bus 350.

If the memory system 10 is mounted into a solid state disk/drive, the booting speed of the computing system 300 may be increased or accelerated. Although not shown in FIG. 14, it will be obvious to person having ordinary skill in the art that an application chipset, and/or a camera image processor may be further included in the system according to an example embodiment of the present invention.

The phase change memory device according to an example embodiment of the present invention repairs one of a local conductor line, e.g., a local bitline or a local wordline, or a global conductor line, e.g., a global bitline or a global wordline. If there are relatively less defective cells or a defect occurs in a local conductor line, the local conductor line is repaired. If there are more defective cells or a defect occurs in the global conductor line, the global conductor line is repaired. Accordingly, redundancy efficiency is improved.

Although the present invention has been described in connection with the example embodiments of the present invention illustrated in the accompanying drawings, it is not limited thereto. It will be apparent to those skilled in the art that various substitution, modifications and changes may be thereto without departing from the scope and spirit of the invention.

What is claimed is:

1. A phase change memory device comprising:
   a plurality of memory banks;
   a plurality of local conductor lines connected to the plurality of memory banks;
   at least one global conductor line connected to the plurality of local conductor lines; and
   at least one repair control circuit configured to selectively replace at least one of the at least one global conductor line with at least one redundant global conductor line and configured to selectively replace at least one of the plurality of local conductor lines with at least one redundant local conductor line, wherein the at least one repair control circuit selectively replaces at least one of the plurality of local conductor lines with the at least one local redundant conductor line if a defect occurs in the at least one of the plurality of local conductor lines and the memory cells connected to the at least one of the plurality of local conductor lines.

2. The phase change memory device of claim 1, wherein, the plurality of memory banks are arranged in a stacked structure, with each of the memory banks divided into a plurality of address groups,
   each of the plurality of address groups includes at least one of the plurality of local conductor lines, and the at least one of the plurality of local conductor lines for each of the plurality of address groups is connected to the at least one global conductor line.

3. The phase change memory device of claim 2, wherein the at least one global redundant conductor line includes at least one redundant global bitline for reading and at least one redundant global bitline for writing, and the at least one local redundant conductor line is at least one redundant local bitline.

4. The phase change memory device of claim 2, wherein the at least one global conductor line is commonly connected to the plurality of local conductor lines of the address groups that correspond to each of the plurality of memory banks.

5. The phase change memory device of claim 2, wherein the at least one global conductor line is at least one global wordline and the at least one global redundant conductor line is at least one redundant global wordline.

6. The phase change memory device of claim 5, wherein each of the memory banks includes a row of the plurality of address groups and at least one redundant address group, with at least one of the rows of address groups commonly connected to a row decoder via the at least one global wordline and with the at least one redundant address group commonly connected to a redundant row decoder via the redundant global wordline.

7. The phase change memory device of claim 5, wherein the plurality of local conductor lines are a plurality of local wordlines and the at least one local redundant conductor line is at least one redundant local wordline, where each of the rows of address groups are connected to the at least one global wordline via the plurality of local wordlines.

8. A memory system comprising:
the phase change memory device of claim 1; and
a controller configured to control the phase change memory device.

9. The memory system of claim 8, wherein the phase change memory device and the controller are integrated into a semiconductor device.

10. A phase change memory device comprising:
a plurality of memory banks;
a plurality of local conductor lines connected to the plurality of memory banks, the plurality of memory banks being arranged in a stacked structure, with each of the memory banks divided into a plurality of address groups, each of the plurality of address groups including at least one of the plurality of local conductor lines;
at least one global conductor line connected to the plurality of local conductor lines, the at least one of the plurality of local conductor lines for each of the plurality of address groups being connected to the at least one global conductor line; and
at least one repair control circuit configured to selectively replace at least one of the at least one global conductor line with at least one redundant global conductor line and configured to selectively replace at least one of the plurality of local conductor lines with at least one redundant local conductor line, and wherein
the at least one repair control circuit substitutes the at least one global conductor line with the at least one global redundant conductor line if a defect occurs in the at least one global conductor line.

11. A phase change memory device comprising:
a plurality of memory banks;
a plurality of local conductor lines connected to the plurality of memory banks, the plurality of memory banks being arranged in a stacked structure, with each of the memory banks divided into a plurality of address groups, each of the plurality of address groups including at least one of the plurality of local conductor lines;
at least one global conductor line connected to the plurality of local conductor lines, the at least one of the plurality of local conductor lines for each of the plurality of address groups being connected to the at least one global conductor line; and
at least one repair control circuit configured to selectively replace at least one of the at least one global conductor line with at least one redundant global conductor line and configured to selectively replace at least one of the plurality of local conductor lines with at least one redundant local conductor line, and wherein
the at least one global conductor line includes global bitlines for reading and global bitlines for writing and the plurality of local conductor lines are a plurality of local bitlines.

12. The phase change memory device of claim 11, wherein the at least one repair circuit is further configured to store information for at least one of the at least one replaced global conductor line and the replaced at least one of the plurality of local conductor lines.

13. The phase change memory device of claim 12, wherein the at least one repair control circuit includes,
a master repair circuit including a plurality of fuses corresponding to the global bitlines for reading and writing and receiving a column address, where the master repair circuit activates a first active signal in response to an output of at least one of the plurality of fuses of the master repair circuit,
a first slave repair circuit including a plurality of fuses corresponding to the plurality of memory banks and receiving a bank address, where the first slave repair circuit activates a second active signal in response to an output of at least one of the plurality of fuses of the first slave repair circuit, and
a second slave repair circuit including a plurality of fuses corresponding to at least one of the plurality of local bitlines, the plurality of fuses of the second slave repair circuit receiving the column address and at least one of the first and second active signals, where the second slave repair circuit activates at least one flag in response to an output of at least one of the plurality of fuses of the second slave repair circuit.

14. The phase change memory device of claim 11, wherein each of memory banks includes a row of the plurality of address groups and at least one redundant address group, with the plurality of local bitlines of each of the address groups connected to at least one of the global bitlines for reading and at least one of the redundant global bitlines for writing.

15. The phase change memory device of claim 11, wherein the global bitlines for reading and global bitlines for writing are each commonly connected to a column of address groups, with each of the address groups corresponding to one of the plurality of memory banks.

16. The phase change memory device of claim 11, wherein the plurality of local bitlines are respectively connected to the global bitlines for reading and writing via a first switching unit and a second switching unit.

17. The phase change memory device of claim 16, wherein each of memory banks includes a row of the plurality of address groups and at least one redundant address group, with each of the at least one redundant address groups of each of the memory banks commonly connected to the at least one redundant global bitline for reading and the at least one redundant global bitline for writing via the at least one redundant local bitline of each of the at least one redundant address groups.

18. A phase change memory device comprising:
a plurality of memory banks each including a plurality of address groups and at least one redundant address group;

a plurality of local conductor lines connected to each of the address groups and at least one redundant local conductor line connected to the at least one redundant address group; and at least one global conductor line connected to the plurality of local conductor lines of each of the address groups;

at least one redundant global conductor line connected to the at least redundant local conductor line of the at least one redundant address group; and at least one repair control circuit configured to selectively replace at least one of the at least one global conductor line with the at least one redundant global conductor line and configured to selectively replace at least one of the plurality of local conductor lines with the at least one redundant local conductor line, wherein the at least one repair control circuit selectively replaces at least one of the plurality of local conductor lines with the at least one local redundant conductor line if a defect occurs in the at least one of the plurality of local conductor lines and the memory cells connected to the at least one of the plurality of local conductor lines.

19. A phase change memory device comprising:

at least one global conductor line connected to a plurality of local conductor lines; and at least one repair control circuit configured to selectively replace at least one of the at least one global conductor line with at least one redundant global conductor line and configured to selectively replace at least one of the plurality of local conductor lines with at least one redundant local conductor line, where the at least one repair control circuit includes, a master repair circuit including a plurality of fuses corresponding to the at least one global conductor line and receiving a column address, where the master repair circuit activates a first active signal in response to an output of at least one of the plurality of fuses of the master repair circuit, a first slave repair circuit including a plurality of fuses corresponding to a plurality of memory banks and receiving a bank address, where the first slave repair circuit activates a second active signal in response to an output of at least one of the plurality of fuses of the first slave repair circuit, and a second slave repair circuit including a plurality of fuses corresponding to the plurality of local conductor lines, the plurality of fuses of the second slave repair circuit receiving the column address and at least one of the first and second active signals, where the second slave repair circuit activates at least one flag in response to an output of at least one of the plurality of fuses of the second slave repair circuit.

\* \* \* \* \*